(12) United States Patent
Tomaki et al.

(10) Patent No.: US 9,107,323 B2
(45) Date of Patent: Aug. 11, 2015

(54) BAND-PASS FILTER MODULE AND MODULE SUBSTRATE

(75) Inventors: Shigemitsu Tomaki, Tokyo (JP);
Yoshikazu Tsuya, Tokyo (JP);
Masamichi Tanaka, Tokyo (JP); Isao Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 268 days.

(21) Appl. No.: 13/811,528

(22) PCT Filed: Jul. 21, 2011

(86) PCT No.: PCT/JP2011/066559
§ 371 (c)(1),
(2), (4) Date: Jan. 22, 2013

(87) PCT Pub. No.: WO2012/011526
PCT Pub. Date: Jan. 26, 2012

(65) Prior Publication Data
US 2013/0120950 A1 May 16, 2013

(30) Foreign Application Priority Data

Jul. 22, 2010 (JP) ................................ 2010-165399

(51) Int. Cl.
*H05K 1/11* (2006.01)
*H05K 1/14* (2006.01)
(Continued)

(52) U.S. Cl.
CPC .............. *H05K 1/18* (2013.01); *H01P 1/20345* (2013.01); *H03H 7/0115* (2013.01);
(Continued)

(58) Field of Classification Search
CPC ....... H03H 9/205; H03H 7/0161; H05K 1/16; H05K 1/181; H05K 1/182; H05K 1/183; H05K 1/0225; H05K 1/0227; H05K 1/0233; H05K 2201/1006
USPC ......................... 361/760–763, 782–784, 803; 333/24–32, 195–204
See application file for complete search history.

(56) References Cited

U.S. PATENT DOCUMENTS 5,375,035 A * 12/1994 Stoddard .................... 361/306.2
5,508,665 A *  4/1996 Chan et al. ................ 331/117 D
(Continued)

FOREIGN PATENT DOCUMENTS

CN         1393044 A       1/2003
CN         1476670 A       2/2004
(Continued)

OTHER PUBLICATIONS (Machine Translation) Toujo, Surface-Mounted Passive Electronic Components, and Structure and Method for Mounting them, WO 2005062464 A1.*
(Continued)

*Primary Examiner* — Tuan T Dinh
(74) *Attorney, Agent, or Firm* — Oblon, McClelland, Maier & Neustadt, L.L.P.

(57) ABSTRACT

A bandpass filter module includes a mounting board and a BPF chip mounted on a surface thereof. The BPF chip includes three or more resonators; a first-stage resonator located closest to an input terminal, a final-stage resonator located closest to an output terminal, and a middle-stage resonator connected between the first-stage and the final-stage resonators and located in a chip middle zone. The mounting board includes an area overlapping with the chip middle zone, viewed in plan, defining a ground-free space in which no ground electrode is disposed. The ground-free space is formed at least from the surface of the mounting board to a depth position at which a topmost internal wiring layer is located. The middle-stage resonator is prevented from being coupled to ground electrodes on the mounting board and from a lower Q-value and increased insertion loss.

12 Claims, 18 Drawing Sheets

(51) Int. Cl.
    *H05K 1/18* (2006.01)
    *H01P 1/203* (2006.01)
    *H05K 1/02* (2006.01)
    *H03H 7/01* (2006.01)
    *H03H 1/00* (2006.01)

(52) U.S. Cl.
    CPC .......... *H03H 7/0123* (2013.01); *H03H 7/1708* (2013.01); *H03H 7/1775* (2013.01); *H05K 1/0243* (2013.01); *H05K 1/11* (2013.01); *H05K 1/115* (2013.01); *H03H 2001/0085* (2013.01); *H05K 1/0224* (2013.01); *H05K 1/181* (2013.01)

(56) References Cited

U.S. PATENT DOCUMENTS

| | | | |
|---|---|---|---|
| 5,532,658 | A | 7/1996 | Tonegawa et al. |
| 6,414,568 | B1 | 7/2002 | Matsumura et al. |
| 6,444,066 | B1* | 9/2002 | Sugimoto ................. 156/89.17 |
| 6,445,262 | B1 | 9/2002 | Tanaka et al. |
| 8,120,446 | B2 | 2/2012 | Tomaki et al. |
| 2003/0048156 | A1 | 3/2003 | Uriu et al. |
| 2004/0026361 | A1 | 2/2004 | Namba et al. |
| 2004/0066337 | A1 | 4/2004 | Fukuda et al. |
| 2006/0006760 | A1 | 1/2006 | Namba et al. |
| 2009/0178828 | A1* | 7/2009 | Tsumura et al. ............... 174/252 |
| 2009/0266900 | A1* | 10/2009 | Ikemoto et al. ............... 235/492 |
| 2010/0073108 | A1* | 3/2010 | Yamasita et al. ............. 333/204 |

FOREIGN PATENT DOCUMENTS

| | | |
|---|---|---|
| CN | 1500297 A | 5/2004 |
| CN | 200956397 Y | 10/2007 |
| EP | 1170817 A1 * | 1/2002 |
| JP | 7 183637 | 7/1995 |
| JP | 7 202505 | 8/1995 |
| JP | 9 116248 | 5/1997 |
| JP | 2001 102957 | 4/2001 |
| JP | 2004 311734 | 11/2004 |
| JP | 2008 141426 | 6/2008 |
| JP | 2009 124211 | 6/2009 |
| WO | WO 2005062464 A1 * | 7/2005 |
| WO | 2009 096003 | 8/2009 |

OTHER PUBLICATIONS

Sutono et al., Transactions on Microwave Theory and Techniques, Oct. 2001, IEEE, vol. 49, No. 10.*
Combined Office Action and Search Report issued Mar. 19, 2014 in Chinese Patent Application No. 201180035927.3 with English translation of categories of cited documents.
International Search Report Issued Oct. 25, 2011 in PCT/JP11/66559 Filed Jul. 21, 2011.

* cited by examiner

BAND-PASS FILTER MODULE AND MODULE SUBSTRATE

TECHNICAL FIELD

The present invention relates to a bandpass filter module and a module board, and more particularly, to techniques for avoiding the influence (deteriorations in filter characteristics) exerted by a ground electrode, a shield case, and the like disposed on a mounting board in a modular structure for mounting a bandpass filter in the form of chip on the surface of the mounting board.

BACKGROUND ART

As electronic devices have been increasingly reduced in size and height and provided with more functions, electronic parts which comprise the devices are highly required to be reduced in size and height (thickness), increased in functionality and integration. For example, a bandpass filter (hereinafter sometimes referred to as the "BPF") employed in a communication device such as a portable phone, a wireless LAN device, and the like, plays an important role of selecting frequencies while removing unwanted waves for the communication device. For responding to such requirements, the bandpass filter may be provided as a filter chip which has a resonator formed within a laminated ceramic board that is more beneficial for a reduction in size and height and for higher integration.

A laminated ceramic board may employ, for example, an LTCC (Low Temperature Co-fired Ceramics) board, inductor electrodes and capacitor electrodes are distributively placed on a variety of wiring layers within the board, and a plurality of stages of resonators are disposed between an input terminal and an output terminal, thereby forming a predetermined pass band.

Then, the filter chip thus constructed is electrically and mechanically connected to the surface of a mother board or a board which forms part of a module (hereinafter referred to as the "mounting board").

Additionally, the following patent documents 1-4 disclose such electronic parts.

PRIOR ART DOCUMENTS

Patent Documents

Patent Document 1: JP-A-7-202505
Patent Document 2: JP-A-2001-102957
Patent Document 3: JP-A-2004-311734
Patent Document 4: JP-A-2009-124211

SUMMARY OF THE INVENTION

Notably, as an electronic part is reduced more in height, circuit components (circuit elements, connection conductors, ground electrodes, and the like) arranged within the electronic part must be spaced closer to one another, or such circuit components must be spaced closer to circuit components disposed on a mounting board. As such, when a filter including an LC resonator, for example, is to be reduced in height, the filter is more susceptible to deteriorations in filter characteristics, caused by stray capacitance and undesired electromagnetic coupling, such as a lower Q-value due to an inductor included in the filter which is placed closer to the ground electrode.

In other instances, to prevent such deteriorations in characteristics, a variety of techniques have been applied to the arrangement, shape, and the like of conductors within a laminated board which forms part of a filter (see the above-cited Patent Documents 3, 4). Additionally, in some structures employed for this purpose, some conductors may be laminated in a direction orthogonal to that of other conductors in some of a plurality of resonators that comprise a bandpass filter, or lamination may be made with the resonators having all their inductor electrodes and capacitor electrodes oriented vertically (orthogonal to the surface of the mounting board) (see FIGS. 3-5, later described).

However, so far proposed structures are all directed to a single part or a single board, and sufficient proposals have not been necessarily made fully in consideration of the structure of a filter chip and the structure of a mounting board on which the filter chip is mounted.

Accordingly, it is an object of the present invention to provide more preferable structures for a bandpass filter and a mounting board on which the bandpass filter is mounted, and more specifically, to provide good filter characteristics even when a filter chip is reduced in height.

To solve the above problem and achieve the object, a BPF (bandpass filter) module according to the present invention comprises a mounting board capable of mounting a filter chip on a surface thereof, and a filter chip mounted on the surface of the mounting board. The mounting board has one or more internal wiring layers, and the filter chip includes three or more resonators connected between an input terminal and an output terminal for forming a predetermined pass band. The filter chip includes a chip middle zone defined by an area contained between one longitudinal side and the other longitudinal side of the filter chip, where the chip middle zone includes a chip center zone defined by an area contained between one lateral side and the other lateral side of the filter chip. The three or more resonators include a first-stage resonator connected closest to the input terminal, a final-stage resonator connected closest to the output terminal, and a middle-stage resonator connected between the first-stage resonator and the final-stage resonator, and the middle-stage resonator is disposed in the chip middle zone. Further, the mounting board includes an area overlapping with the chip center zone, when viewed in plan. This area defines a ground-free space in which no ground electrode is disposed. The ground-free space is formed at least from the surface of the mounting board to a depth position at which a topmost internal wiring layer is located among the one or more internal wiring layers.

According to such a modular structure of the present invention, the ground-free space is formed below the middle-stage resonator, where no ground electrode is disposed. With this structure, the filter characteristics can be prevented from deteriorations which would otherwise be caused by the middle-stage resonator placed in close proximity to the ground electrode. More specifically, an inductor included in the middle-stage resonator can be prevented from being electromagnetically coupled to the ground electrode disposed on the mounting board to deteriorate the filter characteristics. Additionally, the middle-stage resonator can be prevented from a lower Q-value and an increased insertion loss in the filter characteristics.

Also, the ground-free space refers to a space in which no ground electrode should be disposed (a three-dimensional space which is defined by an extension viewed in plan and a space in the height direction, represented by a portion indicated by reference numeral 80 in FIG. 8 or by reference numeral S5 in FIG. 26). This ground-free space may not be necessarily provided with something in particular as long as no ground electrode is disposed therein. For example, the ground-free space may comprise a hollow, for example, a hole formed through an associated area of the mounting board, or may be part of the mounting board (which excludes the ground electrode but includes, for example, an insulating material which may form part of the mounting board). In this regard, the ground-free space may be filled with a different material from materials which comprise other portions of the mounting board as long as the material does not cause electromagnetic coupling with the middle-stage resonator, such as an insulating material.

Further, in addition to the exclusion of ground electrode, the ground-free space is preferably free from conductors other than the ground electrode from a viewpoint of providing satisfactory filter characteristics.

The ground-free space may have such a volume that it extends at least from the surface of the mounting board to the position (depth) at which the topmost internal wiring layer is formed, with respect to the width direction (depth) of the mounting board. Thus, no ground electrode should be disposed in this space (from the surface of the mounting board to the aforementioned depth). Alternatively, the ground-free space may extend to the back surface of the mounting board. In other words, the ground electrode may be excluded over the overall thickness of the mounting board (all internal wiring layers below the topmost internal wiring layer and the back surface of the mounting board) in an area of the mounting board which overlaps with the chip center zone (hereinafter referred to as the "area beneath the chip center zone"), when viewed in plan. However, even within this area beneath the chip center zone, the ground electrode could be disposed on an internal wiring layer below the topmost internal wiring layer or on the back surface of the mounting board.

However, when the ground electrode is disposed in the area beneath the chip center zone in this way, the ground electrode is preferably located on a lowest possible internal wiring layer of the mounting board from a viewpoint of preventing deteriorations in the characteristics of the filter. Notably, as to areas other than the area beneath the chip center zone, the present invention does not prohibit the ground electrode from being disposed on the surface of the mounting board or on the topmost internal wiring board.

On the other hand, the ground-free area is designed to have a width (extension/size when viewed in plan) which corresponds at least to the chip center zone, as described above, but may be larger than this. For example, the ground-free zone may substantially match with the plane shape of the filter chip (the size of the filter chip when viewed in plan). In the following, the area of the mounting board corresponding to (matching with) the plane shape of the filter chip (the area of the mounting board opposite to the bottom of the filter chip) is referred to as the "area beneath the chip."

Also, for example, when a ground terminal is disposed on the bottom of the filter chip, a ground electrode (ground terminal electrode) is disposed on the surface of the mounting board for connecting to the ground terminal, and the ground terminal electrode is formed to extend toward the bottom of the filter chip in order to connect the ground terminal electrode to the ground terminal on the bottom of the filter chip, as in embodiments later described, the ground-free space may be defined to have a width which matches with the area beneath the chip except for an area of the mounting board corresponding to the ground terminal on the bottom of the filter chip, or alternatively, in addition further to this area, the ground-free space may be defined to extend to surroundings of the area beneath the chip.

Also, in one aspect of the BPF module according to the present invention, the resonator is formed of an inductor electrode and capacitor electrodes disposed on some of a plurality of wiring layers included in a laminated board, and the middle-stage resonator comprises an inductor electrode and capacitor electrodes disposed on internal wiring layers of the laminated board. The laminated board used herein can be a ceramic laminated board, for example, an LTCC board or the like.

When the filter chip is implemented using a laminated board in the present invention, the filter chip may be equally divided by two in a thickness direction, wherein the middle-stage resonator is disposed in a lower half close to the mounting board (in a lower portion of the chip). This is intended to avoid the influence exerted by a conductor which may be routed above the filter chip. For example, with such arrangement and structure, even if a shield case is provided to cover the filter chip or the shield case is reduced in height, as will be later described in embodiments, the shield case can be prevented from being electromagnetically coupled to the inductor included in the middle-stage resonator to deteriorate the filter characteristics.

Further, in another aspect of the BPF module according to the present invention, the filter chip comprises a thin-film chip having wiring layers and insulating layers laminated on a surface of a base board by a vapor deposition method, and the resonators are located on wiring layers formed on the surface of the base board.

Also, a module board according to the present invention is a module board which has one or more internal wiring layers and has a filter mounting area on the surface thereof for allowing a filter chip to be mounted thereon. The module board comprises an input terminal electrode disposed on one longitudinal side of the filter mounting area and capable of receiving an input terminal of a filter chip; an output terminal electrode disposed on the other longitudinal side of the filter mounting area and capable of receiving an output terminal of the filter chip; and a ground terminal electrode disposed on one lateral side of the filter mounting area and capable of receiving a ground terminal of the filter chip. The filter mounting area includes a central area which occupies a center zone thereof, when viewed in plan. The central area defines a ground-free space in which no ground electrode is disposed. The ground-free space is formed at least from the surface of the mounting board to a depth position at which a topmost internal wiring layer is located among the one or more internal wiring layers.

Similar to the BPF module, the ground-free space may comprise a hole formed through the surface of the mounting board, or may be filled with an insulating material in the module board.

Further, the BPF module according to the present invention may additionally comprise, on the mounting board, one or more electrical function elements which are electrically connected to the filter chip. Specifically, an electric module according to the present invention comprises any BPF module according to the present invention, and one or more electric function elements mounted on the mounting board and electrically connected to the filter chip.

The electric function elements include both of surface mounted parts mounted on the surface of the mounting board and built-in parts disposed on internal wiring layers of the mounting board, including, for example, in addition to passive elements such as inductor, capacitor, resistor, varistor, and the like, active elements such as transistor and FET, integrated circuit including active elements such as IC, and the like. Also, other than the elements as listed above, a variety of circuit elements such as connection conductors such as conductor line, inter-layer connection conductor (via, throughhole, and the like), ground electrode, terminal electrode, and the like may be disposed on the mounting board.

Further, the electronic module according to the present invention is not limited in type. As an example, a wireless LAN module can be implemented by the present invention. Otherwise, a variety of other modules can be implemented based on the present invention, including, for example, a front end module for a portable communication terminal such as a portable phone, and BPF. Also, a plurality of the BPF according to the present invention may be mounted on the mounting board to implement a communication module which can be used, for example, in two or more frequency bands (dual band module, triple band module, and the like).

The present invention is not either limited in frequency band (pass band) of the BPF in particular. For example, the bandpass filter may be implemented for an 800-MHz band, 1.5-GHz band, 1.7-GHz band, and a 2-GHz band for use by a variety of portable phones, a 1.9-GHz band or 1.8-GHz band for use by PHS, a 2.4-GHz band for use by wireless LAN communications and Bluetooth, and a variety of other frequency bands.

Also, a laminated bandpass filter according to the present invention is suitable for mounting on the module board according to the present invention. The laminate bandpass filter comprises three or more resonators disposed on a laminated board and connected between an input terminal and an output terminal for forming a predetermined pass band. The laminated board includes a chip middle zone defined by an area contained between one longitudinal side and the other longitudinal side of the laminated board. The chip middle zone includes a chip center zone defined by an area contained between one lateral side and the other lateral side of the laminated board. The three or more resonators include a first-stage resonator connected closest to the input terminal, a final-stage resonator connected closest to the output terminal, and a middle-stage resonator connected between the first-stage resonator and the final-stage resonator. The middle-stage resonator is disposed in the chip middle zone. The middle-stage resonator includes an inductor electrode disposed on an internal wiring layer of the laminated board. When the laminated board is equally divided by two in a thickness direction, the inductor electrode is located in a lower half of the laminated board.

According to the present invention, satisfactory filter characteristics can be accomplished even when a BPF chip mounted on a mounting board is reduced in height.

Other objects, features, and advantages of the present invention will be made apparent from the following description of embodiments of the present invention, made in conjunction with the drawings. It should be apparent to those skilled in the art that the present invention is not limited to embodiments described below, and that a variety of alterations can be made within the scope described in the claims. Also, in the drawings, the same reference numerals indicate the same or corresponding parts.

BEST MODE FOR CARRYING OUT THE INVENTION

First Embodiment

A BPF module according to a first embodiment of the present invention comprises a chip-like BPF (bandpass filter, hereinafter referred to as the "BPF chip" or "filter chip" or simply as the "chip"), and a PCB (Printed Circuit Board) for mounting this BPF chip. The PCB comprises a PWB (Printed Wiring Board) which serves as a mounting board, a variety of electronic parts mounted thereon, and circuit elements formed therein such as conductor lines and terminal electrodes for connection, vias, and the like.

Figure 1:
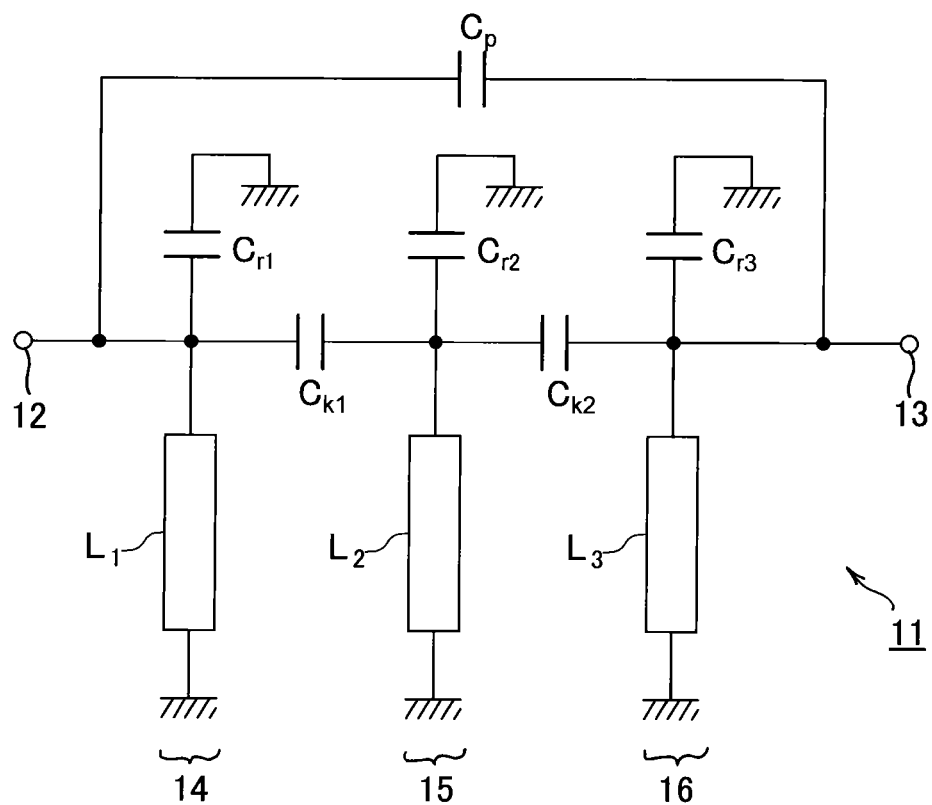
FIG. 1 is an equivalent circuit diagram of a BPF disposed in a BPF module according to a first embodiment of the present invention.

As shown in FIG. 1, a BPF chip 11 comprises three resonators 14, 15, 16 connected in order between an input terminal 12 and an output terminal 13 for forming a predetermined pass band; coupling capacitors (inter-stage capacitors) $C_{k1}$ and $C_{k2}$ for coupling these resonators 14-16; a bypass capacitor (bypass condensor) $C_p$ connected between the input terminal 12 and output terminal 13 in parallel with the resonators 14-16. Each of the resonators 14-16 is an LC parallel resonator which is made up of an inductor $L_1$ and a capacitor $C_{r1}$; an inductor $L_2$ and a capacitor $C_{r2}$; and an inductor $L_3$ and a capacitor $C_{r3}$, respectively.

For convenience, these three resonators 14-16 are designated as a first resonator, a second resonator, and a third resonator in order from the input terminal 12 to the output terminal 13. Specifically, the resonator closest to the input terminal 12 (the first-stage resonator) is the first resonator 14; the resonator closest to the output terminal 13 (the final-stage resonator) is the third resonator 16; and a resonator connected between these first resonator 14 and third resonator 16 (the middle-stage resonator) is the second resonator 15.

Figure 2:
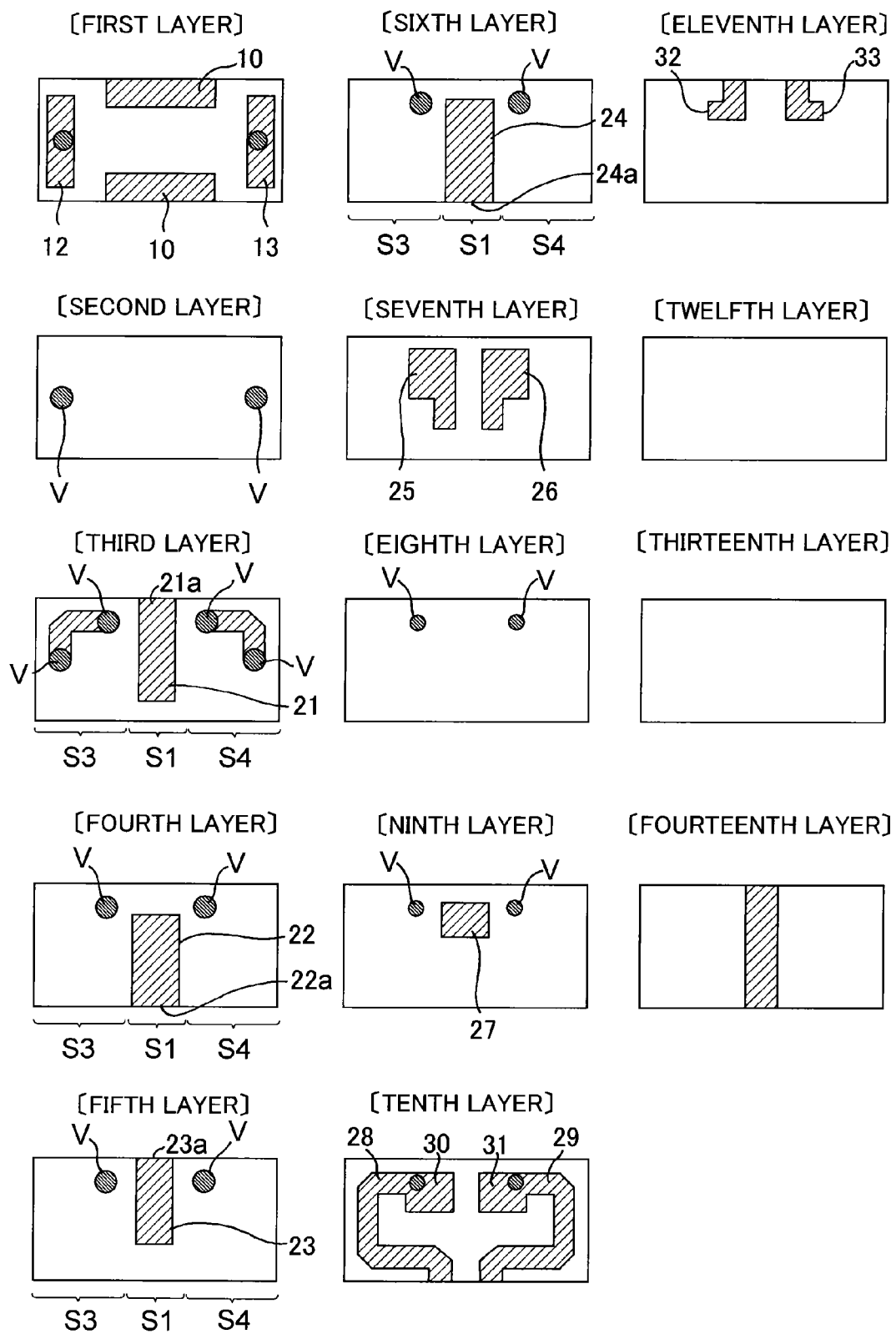
FIG. 2 is a diagram showing a laminated structure (respective wiring layers of a laminated board, from a first through a fourteenth layer) according to the first embodiment.

In this embodiment, each of the resonators 14-16 (inductors $L_1$-$L_3$, capacitors $C_{r1}$-$C_{r3}$) and each of capacitors $C_{k1}$, $C_{k2}$, $C_p$ is implemented by conductor patterns which are formed on respective wiring layers of the LTCC board which has 14 wiring layers, including the back surface of the board, as shown in FIG. 2. Also, in this, the back surface (the bottom of the chip 11) of the board is designated as a first layer, as viewed from the plane (upper side) of the chip 11 when it is mounted on the PCB 70, and upper layers are designated as a second layer, a third layer, a fourth layer, . . . , in order toward the top surface of the board (the top of the chip 11), as they go to upper layers, with the topmost internal wiring layer being designated as a fourteenth layer embodiment (the same goes for a second and subsequent embodiments later described). Also, in FIG. 2, conductor patterns on respective wiring layers are shown as viewed from the bottom of the chip 11 (the same goes for FIGS. 22, 24, later described). Further, in FIG. 2, a circle labeled "V" represents a via (the same goes for FIGS. 22, 24).

The input terminal 12, output terminal 13, and ground terminals 10 are formed on the first layer, which is the back surface of the board, as shown in FIG. 2. The chip 11 (laminated board) has a rectangular shape in plan, and is formed with the input terminal 12 along one end zone (one longitudinal side) in the longitudinal direction (length-wise direction), and the output terminal 13 along the other end zone (the opposite longitudinal side). The ground terminals 10 are also formed respectively along one and the other lateral sides which are on both sides of the transversal direction (widthwise direction).

Figure 26A:
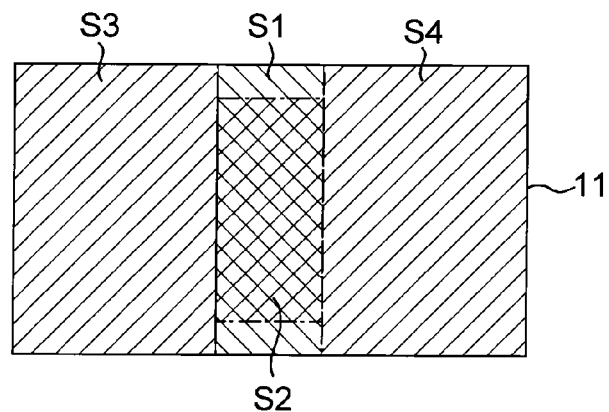
FIG. 26A is a plan view for describing several zones of a chip.
Figure 26B:
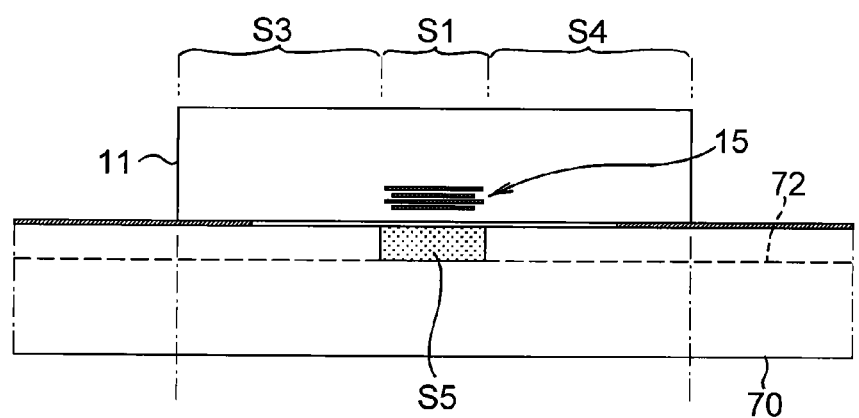
FIG. 26B is a longitudinal sectional view (taken along line y-y in FIG. 6) for describing the chip and the zones of a PCB (mounting board).
Figure 26C:
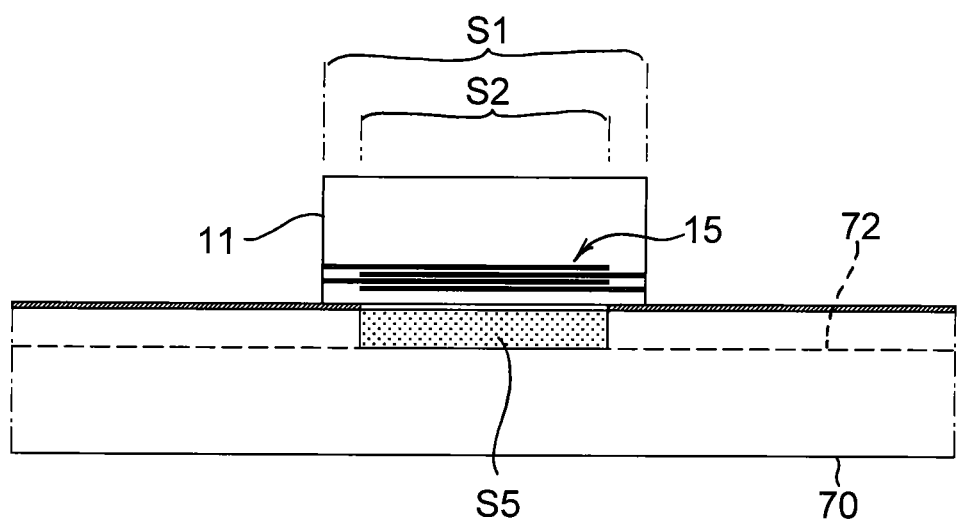
FIG. 26C is a lateral sectional view (taken along line x-x in FIG. 6) for describing the chip and the zones of the PCB (mounting board).

Now, a description will be given of a chip middle zone, a chip center zone, a ground-free space, and the like, with reference to FIGS. 26A-26C. As shown in FIGS. 26A-26C, the chip middle zone is represented by a middle area S1 in the longitudinal direction of the chip 11, and the chip center zone is represented by a center area (cross-hatched area) S2 of the chip 11 which excludes both lateral side areas of the chip 11 from the chip middle area S1. Also, outside of the chip middle zone S1, i.e., one end area S3 in the longitudinal direction of the chip is designated as a one end zone of the chip (or end zone of the chip), while the other end area S4 is designated as another end zone of the chip (or end zone of the chip). Further, the ground-free space, in which the ground electrodes are not disposed, is represented by a space S5 which is located beneath the chip center zone S2 within the mounting board 70 (area that overlaps with the chip center zone S2 when viewed from above) and which extends from the surface 71 of the mounting board to the topmost internal wiring layer 72.

As appreciated, the present invention and embodiments are characterized in that the middle-stage resonator is disposed in the chip middle zone S1, the first-stage resonator and final-stage resonator are disposed in the one-end zone of the chip and the other end zone of the chip, respectively, at least the ground electrodes are excluded in the upper space S5 beneath the chip center zone (area beneath the second resonator), and the like, as described above or as will be later described. However, these requirements related to the arrangement and exclusion should not be strictly applied because benefits intended by the present invention can be provided if a majority of the respective components satisfies the requirements (benefits larger than conventional structures, which would be reduced when compared with implementations that completely satisfy the requirements).

For example, even if a ground electrode is disposed on the surface of the PCB (mounting board) or the topmost internal wiring layer and overlaps with part of the second resonator (middle-stage resonator), the benefits intended by the present invention can be achieved, provided that a majority of the second resonator (middle-stage resonator) does not overlap with the ground electrode. Accordingly, such an arrangement or structure also falls within the scope of the present invention. In another example, even if part of the second resonator (middle-stage resonator) invades into the chip end zone, the middle-stage resonator may be regarded as being disposed in the chip middle zone in accordance with the present invention, provided that a majority of the second resonator remains within the chip middle zone. Likewise, in a further example, even if conductor patterns which form part of the first-stage resonator and final-stage resonator are arranged to overlap with a conductor pattern of the middle-stage resonator, such an arrangement also falls within the scope of the present invention or each embodiment, provided that each resonator satisfies a majority of the aforementioned requirements dictated by the present invention or each embodiment. Furthermore, similar criteria can be applied to other requirements dictated by the present invention and each embodiment.

Referring again to FIGS. 1 and 2, the second resonator 15 is made up of electrodes 21, 22, 23, 24 which are formed on the third layer through the sixth layer such that they stay in the chip middle zone S1 which extends in a middle area of the chip 11 in the longitudinal direction. Specifically, the electrodes 21, 23 extend from one lateral side toward the other lateral side of the chip 11 in a substantially rectangular shape, when viewed in plan, while the electrodes 22, 24 extend from the other lateral side toward the one lateral side in a substantially rectangular shape, when viewed in plan. These electrodes 21, 23 and 22, 24 are alternately laminated on the third layer through the sixth layer such that the electrodes 21, 23 overlap with each other and the electrodes 22, 24 overlap with each other, thereby forming an inductor $L_2$ and a capacitor $C_{r2}$ which comprise the second resonator 15. The alternately laminated electrodes 21-24 have proximal ends 21a-24a which, respectively, are electrically connected to the ground electrodes 10 on the back surface of the board through surface electrodes (not shown) provided on side surfaces of the chip.

On the other hand, the first resonator 14 and third resonator 16 are arranged in the tenth and eleventh layers. The resonator 14 comprises an inductor $L_1$ which is defined by an electrode 28 which is formed to make a loop-shaped pattern along one longitudinal side of the chip 11 in the tenth layer, while the resonator 16 comprises an inductor $L_3$ which is defined by an electrode 29 which is formed to make a loop-shaped pattern along the other longitudinal side of the chip 11 in the tenth layer. Also, electrodes 30, 31 are formed on the tenth layer to be continuous to the inductor electrodes 28, 29, respectively, and electrodes 32, 33 are formed on the eleventh layer to be opposite to the electrodes 30, 31, respectively. These electrodes 30, 31 and 32, 33 comprise a capacitor $C_{r1}$ of the first resonator 14 and a capacitor $C_{r3}$ of the third resonator 16, respectively.

Also, a coupling capacitor $C_{k1}$ couples the first resonator 14 to the second resonator 15, while a coupling capacitor $C_{k2}$ couples the second resonator 15 to the third resonator 16. The coupling capacitors $C_{k1}$, $C_{k2}$ are made up of the electrode 24 formed on the sixth layer and electrodes 25, 26 formed on the seventh layer, respectively. Also, a bypass capacitor $C_p$ is made up of an electrode 27 formed on the ninth layer, and the electrodes 30, 31 formed on the tenth layer to be continuous to the inductor electrodes 28, 29 of the first resonator 14 and third resonator 16, respectively.

In this way, in the chip 11 according to this embodiment, the first resonator 14 is disposed in the one end zone S3 of the chip 11 in the longitudinal direction (in the left-to-right direction on the sheet of FIG. 2); the third resonator 16 is disposed in the other end zone S4; and the second resonator 15 is disposed in the chip middle zone S1 sandwiched by the two end zones of the chip S3, S4.

In other instances, a PCB (mounting board) 70 for mounting the chip 11 thereon has a structure different from that of conventional ones. As such, a conventional module will be first described with reference to FIGS. 3 through 5, followed by a description of a module according to this embodiment in regard to differences from the conventional module.

Figure 3:
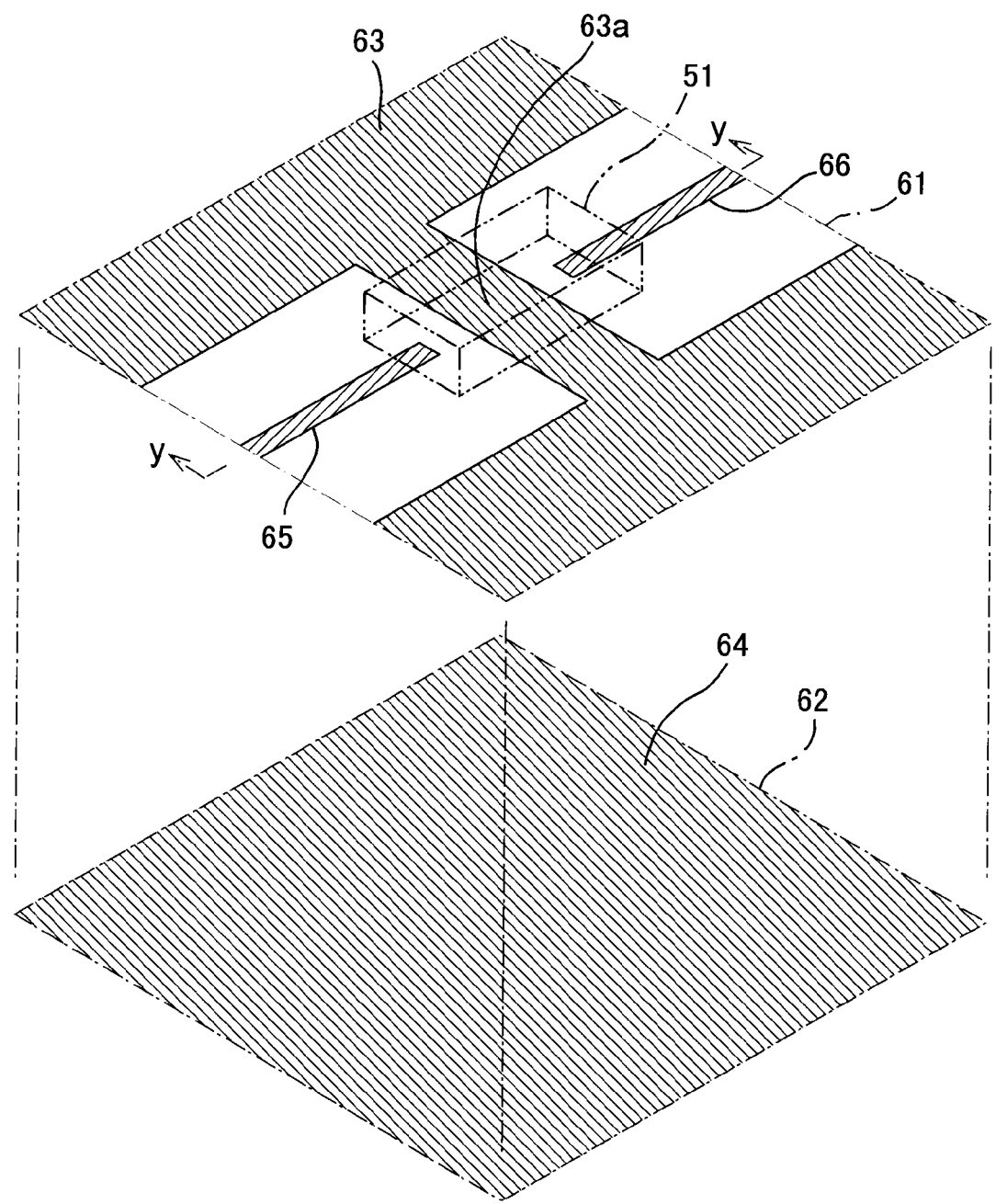
FIG. 3 is a perspective view schematically showing an example of a conventional BPF module in a see-through representation.
Figure 4:
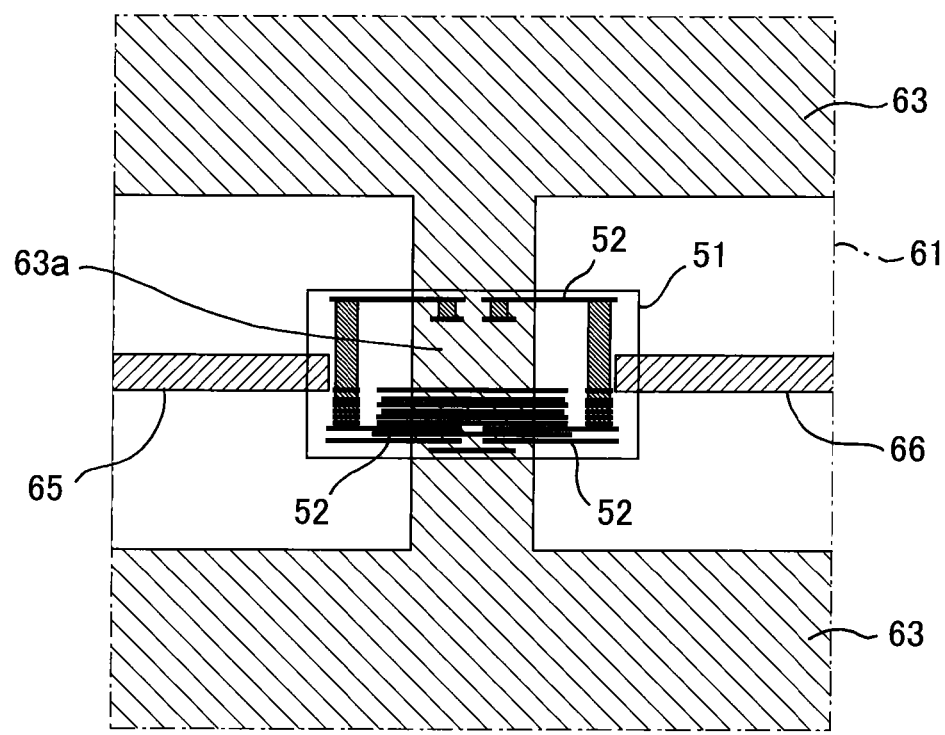
FIG. 4 is a plan view schematically showing the conventional BPF module in a see-through representation.
Figure 5:
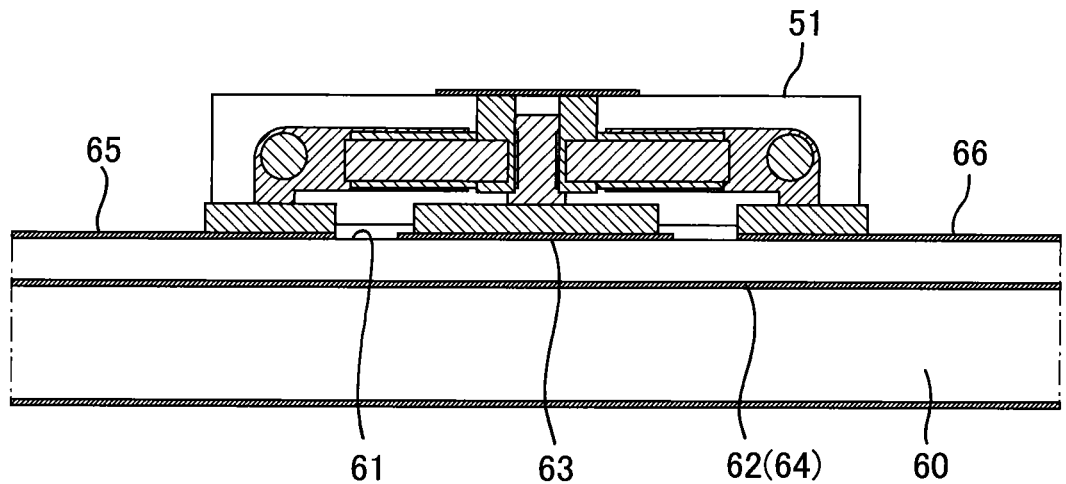
FIG. 5 is a diagram showing the structure of the conventional BPF module in cross section (taken along line y-y in FIG. 3).

As shown in FIGS. 3 through 5, a conventional module of this type is not rarely formed with ground electrodes (so-called ground planes) 63, 64 on a surface 61 of a PCB 60 on which a filter chip 51 is mounted and on an internal wiring layer (for example, the topmost internal wiring layer) 62 close to the surface 61, respectively. In consequence, in an area in which the filter chip 51 is mounted, the ground electrode 63 is not formed around both vertical sides of the chip 51, due to the necessity to route signal paths 65, 66 for connection to input/output terminals of the chip disposed on the bottom on both longitudinal sides thereof, as shown in FIGS. 3-4. However, below the chip middle zone, ground electrodes 63a, 64 are formed respectively on the surface 61 of the PCB 60 and on the upper wiring layer 62 in such a manner that they run across the chip middle zone, when viewed in plan. Then, the ground electrode on the bottom of the chip is connected to the portion of the ground electrode 63a which runs across the chip middle zone.

For reference, this chip 51 in the conventional example is constructed such that inductor electrodes and capacitor electrodes, which form part of the first through third resonators 14-16, are laminated to be orthogonal (to remain upright) to the surface 61 of the PCB 60 (vertical lamination type).

The present inventors, on the other hand, had devoted themselves to studies about the structure of the filter chip as well as the structure of the mounting board for mounting the filter chip thereon, in order to accomplish satisfactory characteristics in spite of a reduction in height of the chip. As a result, the inventors found that the ground electrodes and/or shield case disposed on the mounting board can exert adversary effects on the filter mounted on the surface of the mounting board, and led to work out a new modular structure for preventing the adversary effects.

Figure 6:
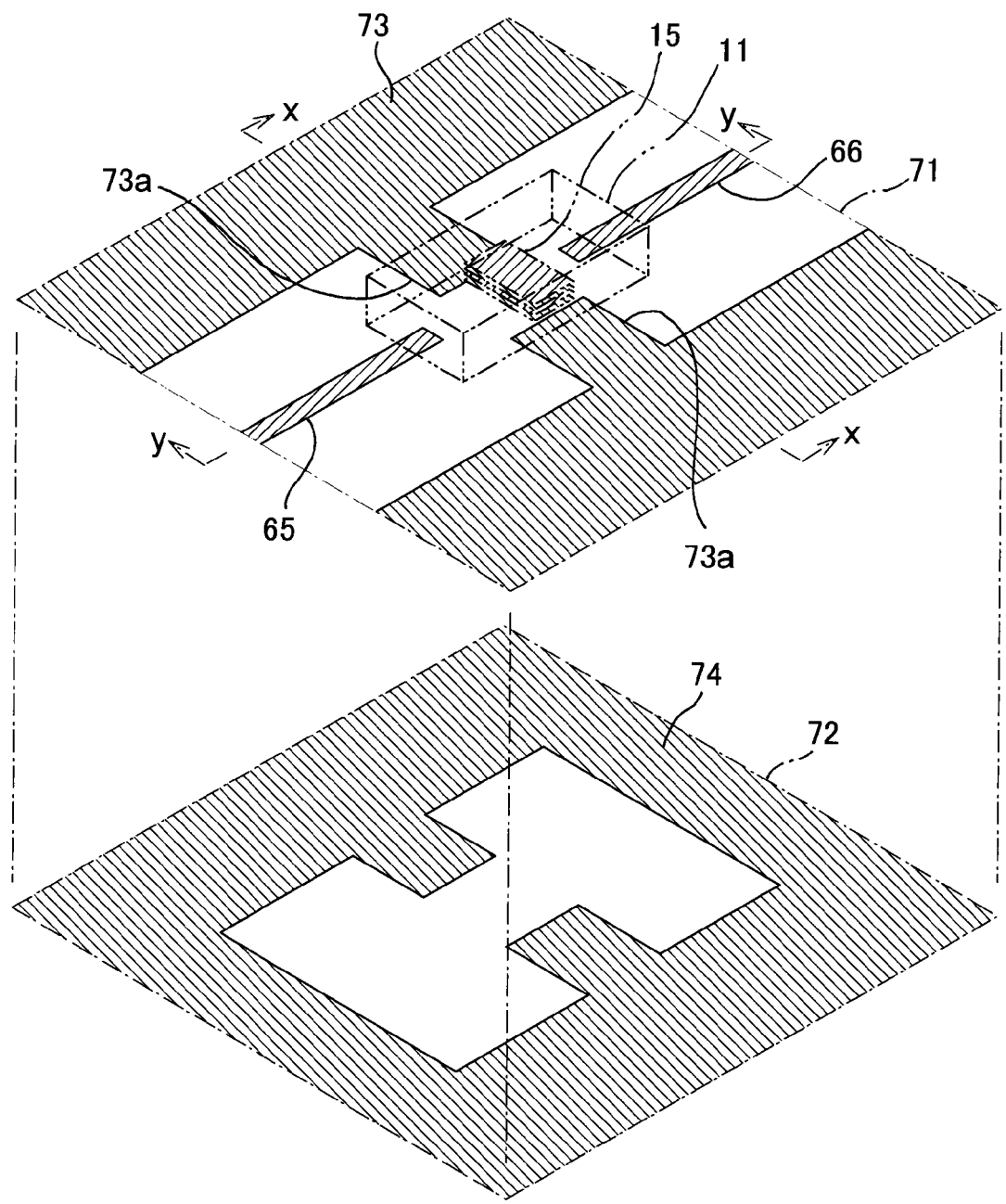
FIG. 6 is a perspective view schematically showing the BPF module according to the first embodiment in a see-through representation.
Figure 7:
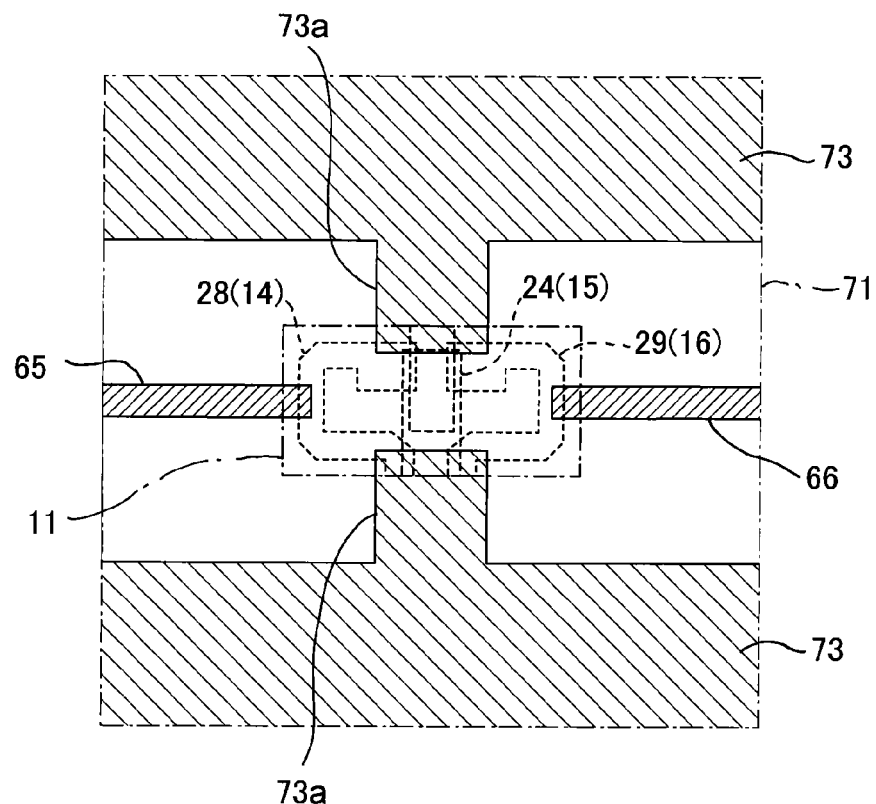
FIG. 7 is a plan view schematically showing the BPF module according to the first embodiment in a see-through representation.
Figure 8:
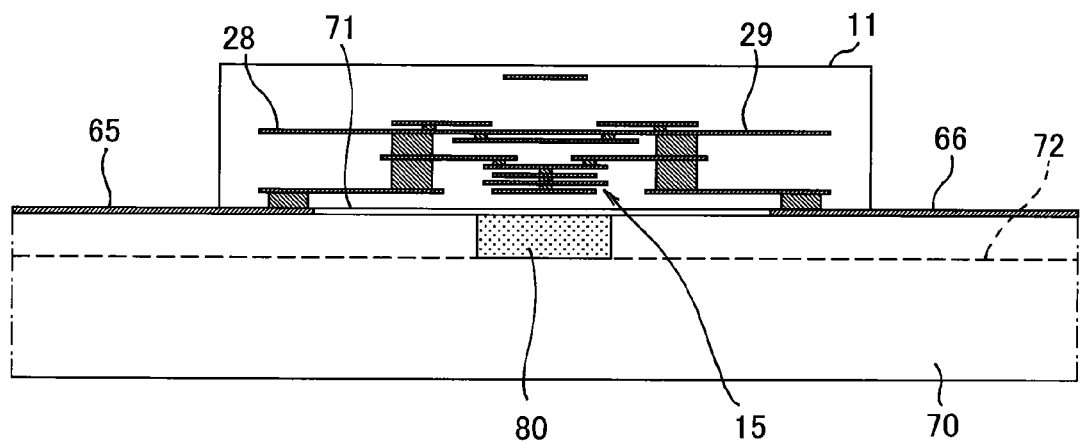
FIG. 8 is a side view showing the structure of the BPF module according to the first embodiment in cross section.

Specifically, as shown in FIGS. 6 through 8, the ground electrode portion 63a disposed beneath the chip in such a manner as to run across the chip middle zone (see FIGS. 3 and 4) is removed from each of ground electrodes 73, 74 disposed on the surface 71 of the PCB 70 and on the topmost internal wiring layer 72, respectively, thus excluding the ground electrodes 73, 74 at least beneath the chip center zone. In this regard, the ground electrode 73 on the surface 71 of the PCB extends up to both lateral sides of the chip 11, as indicated by reference numeral 73a, in order to connect to the ground terminals 10 disposed along the lateral sides on the bottom of the chip.

When the PCB 70 as described above is mounted on the chip 11, a space 80 is formed beneath the second resonator 15 (or a majority of its inductor electrodes 21-24) at least from the surface 71 of the PCB 70 through the topmost internal wiring layer 72, where the ground electrodes 73, 74 are excluded (this three-dimensional space 80 free from the ground electrodes serves as the aforementioned ground-free space). Consequently, the inductor $L_2$ of the second resonator 15 is prevented from electromagnetically coupling to the ground electrodes 73, 74 included in the PCB 70, thus making it possible to obviate the filter characteristics from deteriorations. Additionally, the ground-free space 80 may be filled, for example, with an insulating material which may comprise an insulating layer of the PCB 70, or may be left as an open space (by forming a hole through the surface of the PCB 70). Alternatively, a ground electrode (ground plane) may be formed on the bottom of the PCB 70 or on a lower internal wiring layer, including an area beneath the second resonator 15.

Figure 9:
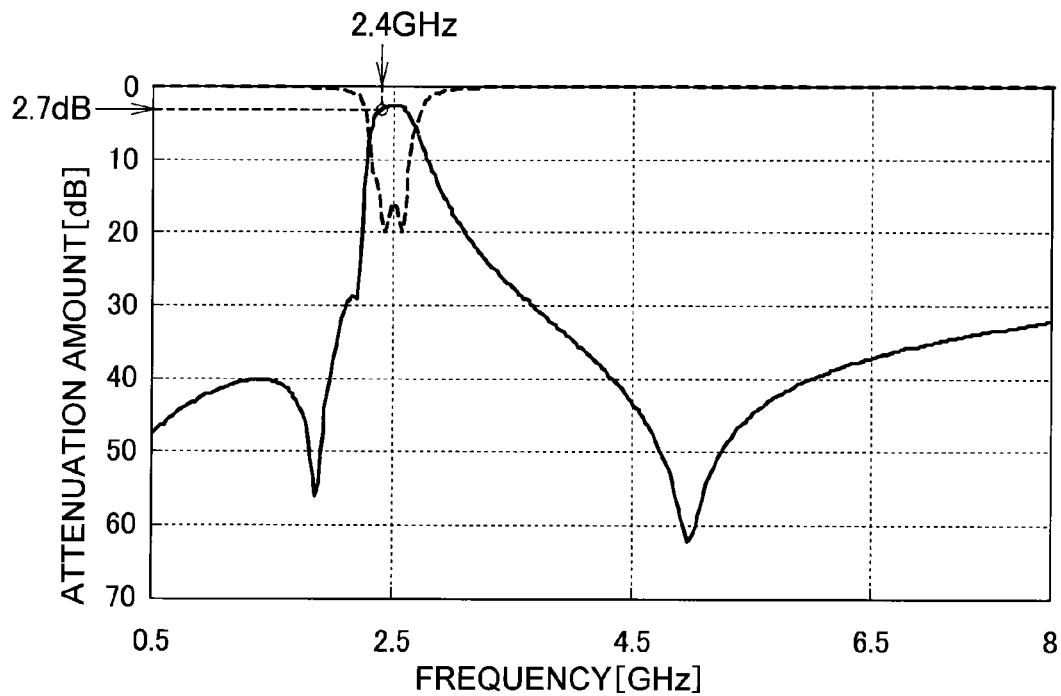
FIG. 9 is a graph representing the frequency characteristic of the BPF in the conventional module.
Figure 10:
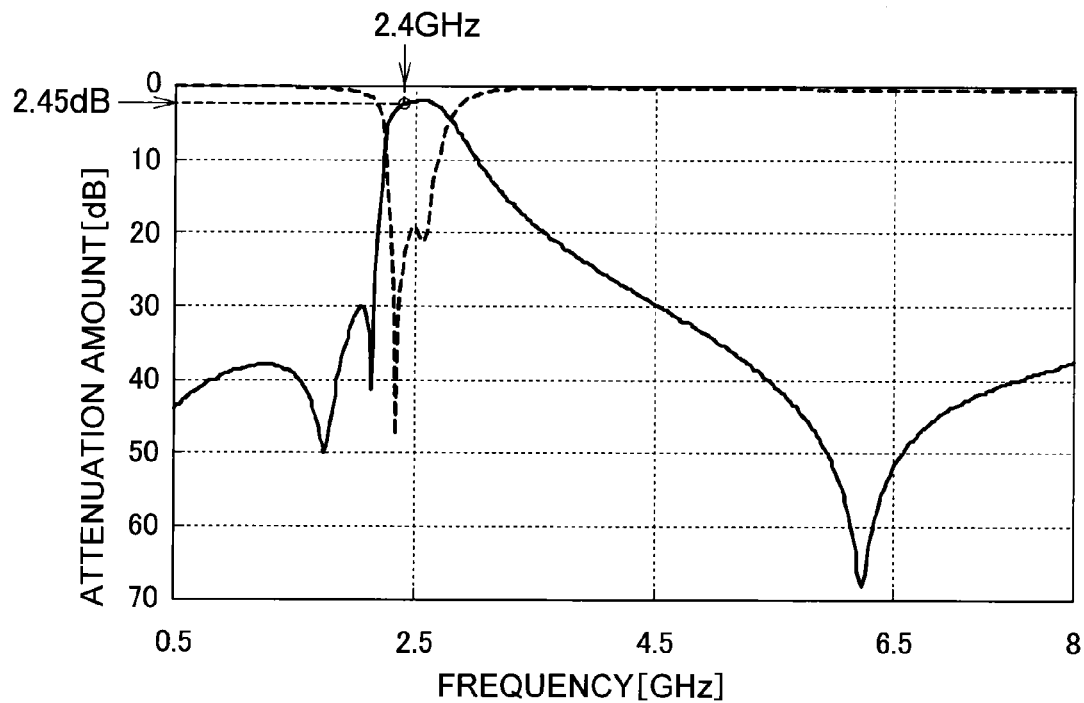
FIG. 10 is a graph representing the frequency characteristic of the BPF in the module according to the first embodiment.

FIG. 9 represents the filter characteristics of the conventional module shown in FIGS. 3-5 (where a solid line represents a pass characteristic, and a broken line represents a cut-off characteristic. These lines are also employed for similar representations in FIG. 10 and FIG. 25, later described), and FIG. 10 represents the filter characteristics of the module according to this embodiment. As is apparent from these graphs, the module according to this embodiment can provide more satisfactory filter characteristics as compared with the conventional module.

Further, Table 1 below shows the result of measuring the Q-value for the second resonators in the first embodiment and in the conventional structure. In this regard, a vertically laminated type refers to a module which comprises a resonator that is made up of electrodes disposed to be orthogonal to the surface of the PCB, as previously shown in FIGS. 3-5, while a horizontally laminated type refers to a module which comprises a resonator that is made up of electrodes laminated in parallel with the surface of the PCB, in a manner similar to this embodiment. As shown in Table 1, it can be seen that the modular structure according to this embodiment can provide a higher Q-value as compared with the conventional horizontally laminated type and vertically laminated type of modules.

TABLE 1

| First Embodiment | 66.7 |
|---|---|
| Conventional Vertically Laminated Type | 41.2 |
| Conventional Horizontally Laminated Type | 48.8 |

[Distance to Ground Electrode]

The inventors also investigated the influence exerted on the filter by the distance from the second resonator to the ground electrode disposed in an area beneath the second resonator.

Figure 11:
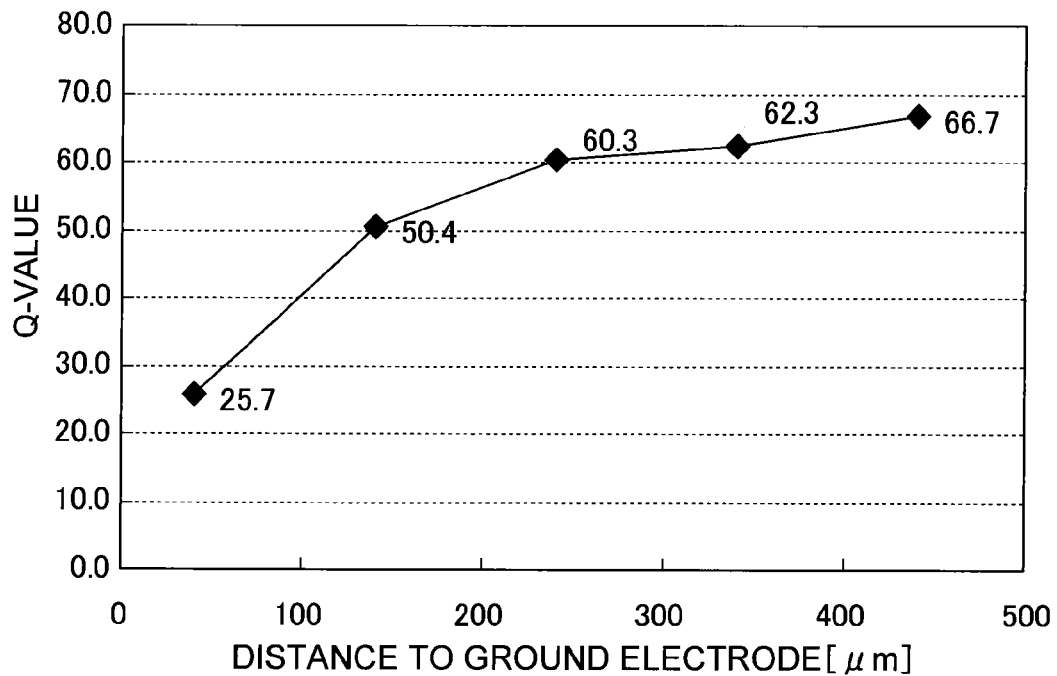
FIG. 11 is a graph representing the Q-value of a second resonator, which is measured while variously changing the distance between the second resonator and a ground electrode of a PCB in the module according to the first embodiment.

Specifically, the ground electrode was placed beneath the second resonator 15, and the Q-value was measured for the second resonator 15 when the distance from the second resonator 15 to the ground electrode (the spacing between the lower surface of the electrode 21 on the third layer and the upper surface of the ground electrode, shown in FIG. 2) was changed to 40 µm, 140 µm, 240 µm, 340 µm, and 440 µm. The result is as shown in Table 2 below and in FIG. 11.

TABLE 2

| Distance to GND (µm) | Q-value |
|---|---|
| 40 | 25.7 |
| 140 | 50.4 |
| 240 | 60.3 |
| 340 | 62.3 |
| 440 | 66.7 |

As appreciated from the result above, while the second resonator is desirably spaced apart from the ground electrode beneath the same by a largest possible distance, a high Q-value can be accomplished by preferably taking a distance of 140 µm or more, and more preferably a distance of 240 µm or more.

Figure 12:
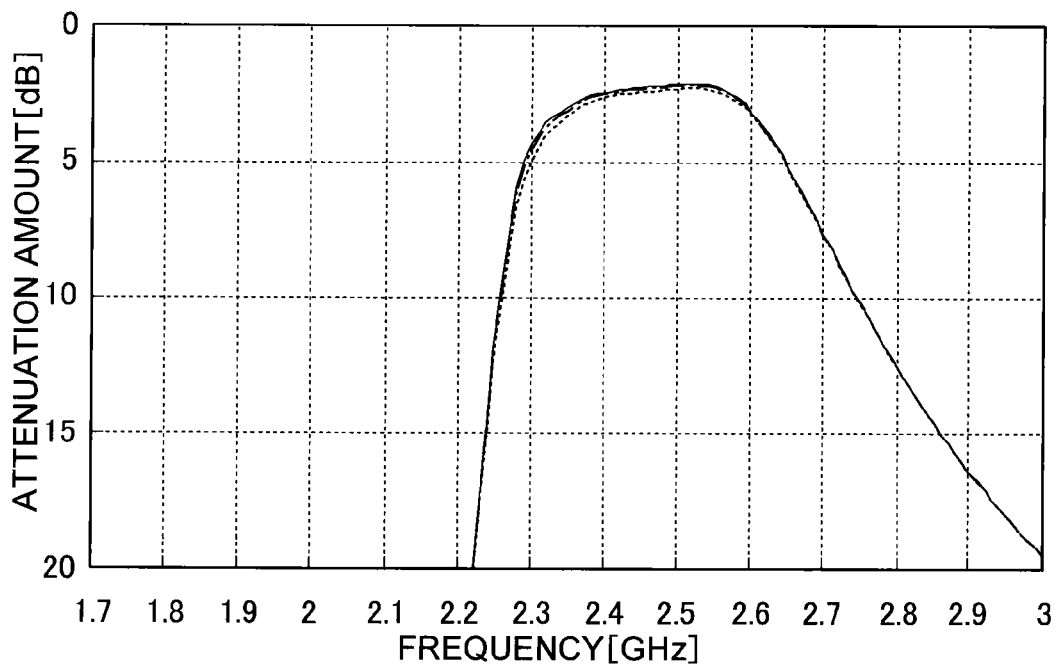
FIG. 12 is a graph representing the pass characteristic of the filter when the distance is variously changed between the second resonator and the ground electrode of the PCB in a similar manner to FIG. 11.
Figure 13:
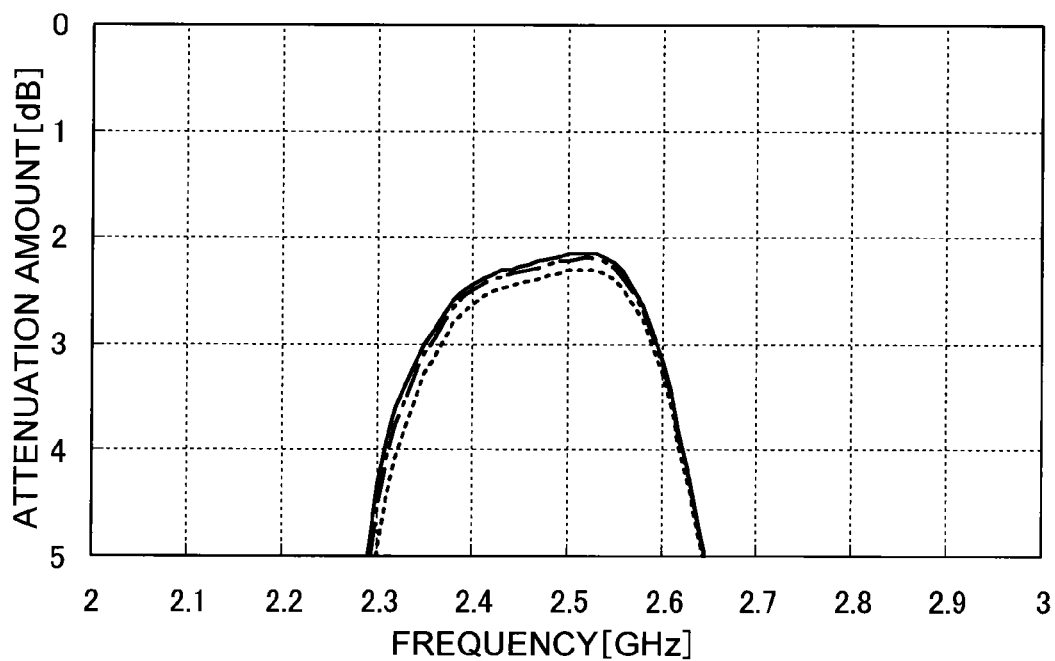
FIG. 13 is a graph showing part of the graph (passband area) in FIG. 12 in an enlarged view.
Figure 14:
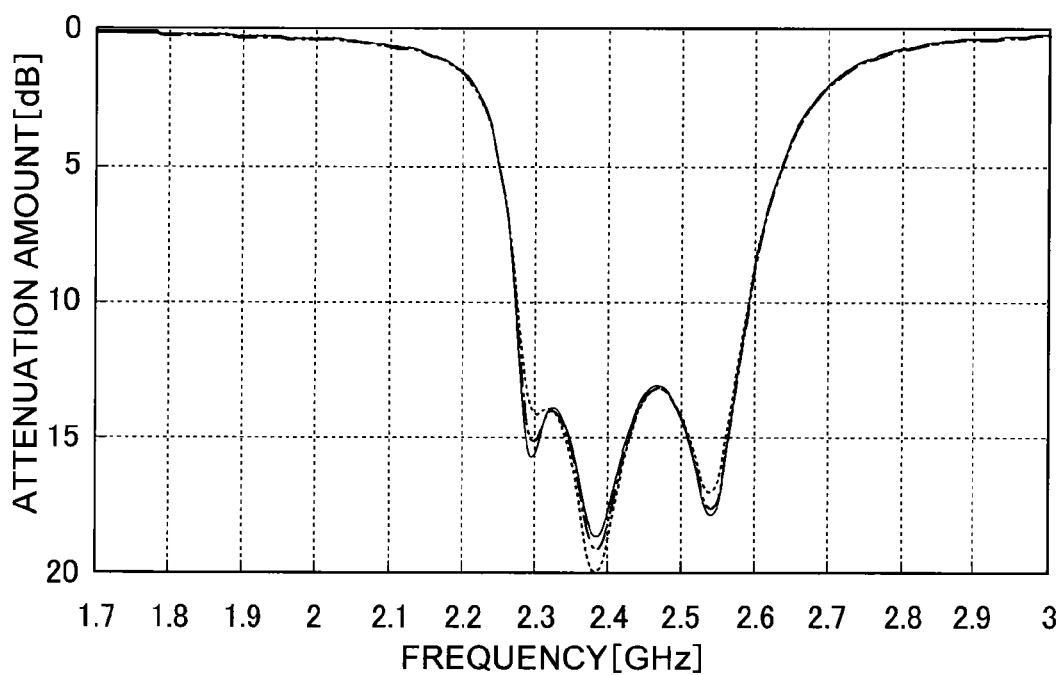
FIG. 14 is a graph representing the cut-off characteristic of the filter when the distance is variously changed between the second resonator and the ground electrode of the PCB in a similar manner to FIG. 11.

FIGS. 12 through 14 further show the filter characteristics when the distance from the second resonator to the ground electrode was changed to 140 µm, 240 µm, and 440 µm (FIG. 12 shows a pass characteristic, FIG. 14 shows a cut-off characteristic, and FIG. 13 is an enlarged view of FIG. 12). In this regard, in these graphs, a solid line represents the characteristic when the distance was chosen to 140 µm; a one-dot-chain line represents the characteristic when the distance was chosen to 240 µm; and a broken line represents the characteristic when the distance was chosen to 440 µm, respectively. As is apparent from these graphs, it is understood that more satisfactory filter characteristics can be accomplished as a larger distance is taken from the second resonator to the ground electrode.

[Influence by Shield Case]

Further, this type of module may often be provided with a shield case 91 to cover the top of the chip 11. As such, the inventors made investigations on the influence by the shield case 91.

Figure 15:
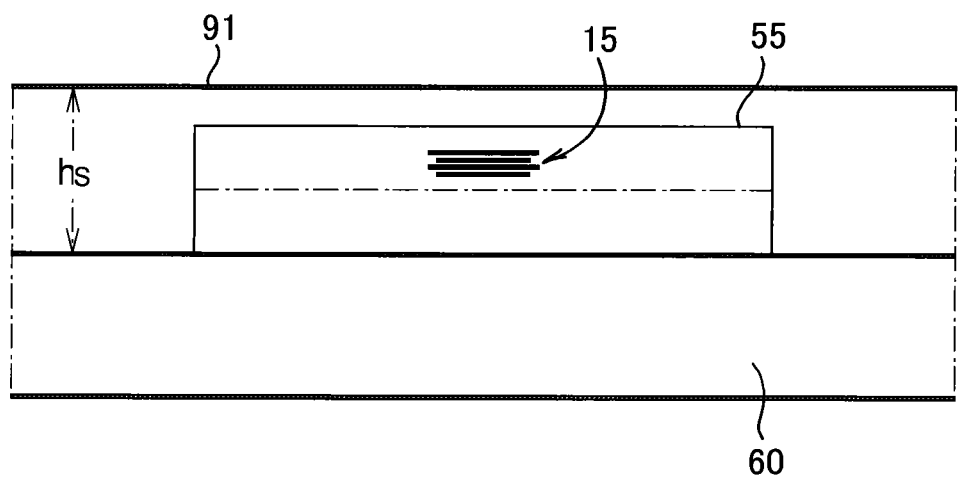
FIG. 15 is a conceptual diagram showing a conventional modular structure from a lateral side.
Figure 16:
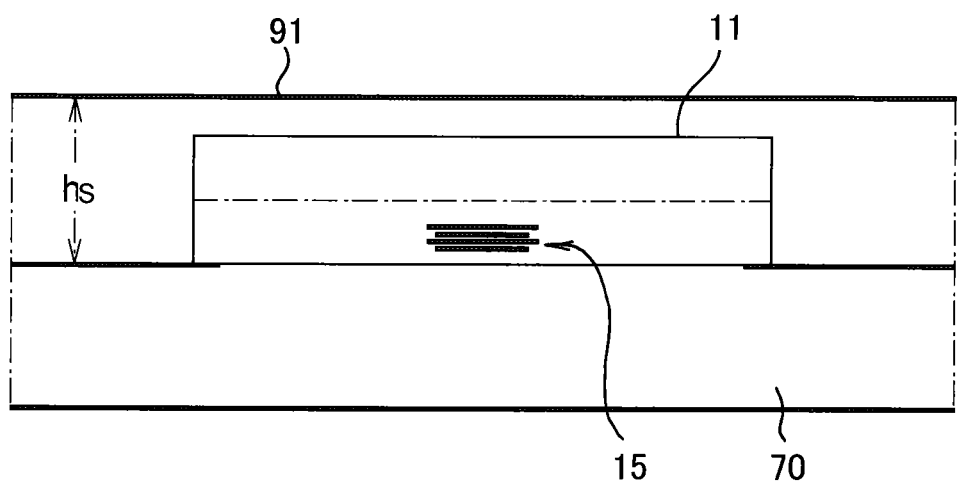
FIG. 16 is a conceptual diagram showing the structure of the module according to the first embodiment from a lateral side in a manner similar to FIG. 14.

FIGS. 15 and 16 show a conventional modular structure and a modular structure according to this embodiment, respectively. As shown in FIG. 15, the conventional module has a second resonator (middle-stage resonator) 15 which is generally disposed in an upper portion of the chip 55. On the contrary, the module according to this embodiment has a second resonator 15 disposed horizontally in a lower portion (a portion below one half of the height of the chip) of the chip 11, as shown in FIG. 16 and aforementioned FIG. 8.

Accordingly, even when the shield case 91 made of an electrically conductive material is placed to cover the chip 11, a sufficient spacing is ensured between the shield case 91 and the second resonator 15 to hardly couple the shield case 91 to the second resonator 15, thus making it difficult introduce deteriorations in characteristics. In this regard, even if the second resonator 15 is disposed in a lower portion of the chip in the foregoing manner, it is possible to eliminate the influence exerted by the ground electrode disposed on the PCB 70. This is because, according to this embodiment, the PCB 70 comprises the ground-free space 80 (the ground electrode is excluded at a height position near the chip 11, beneath the chip center zone in which the second resonator 15 is disposed).

Figure 17:
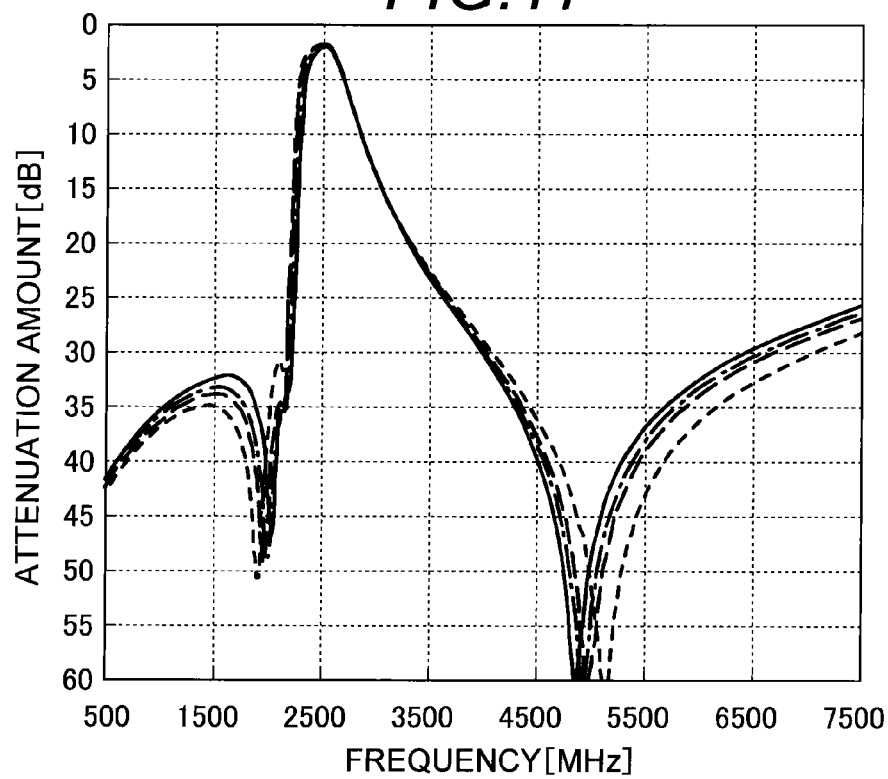
FIG. 17 is a graph representing the frequency characteristic of the filter in the conventional module shown in FIG. 15 when the distance is changed between the surface of the PCB and a shield case.
Figure 18:
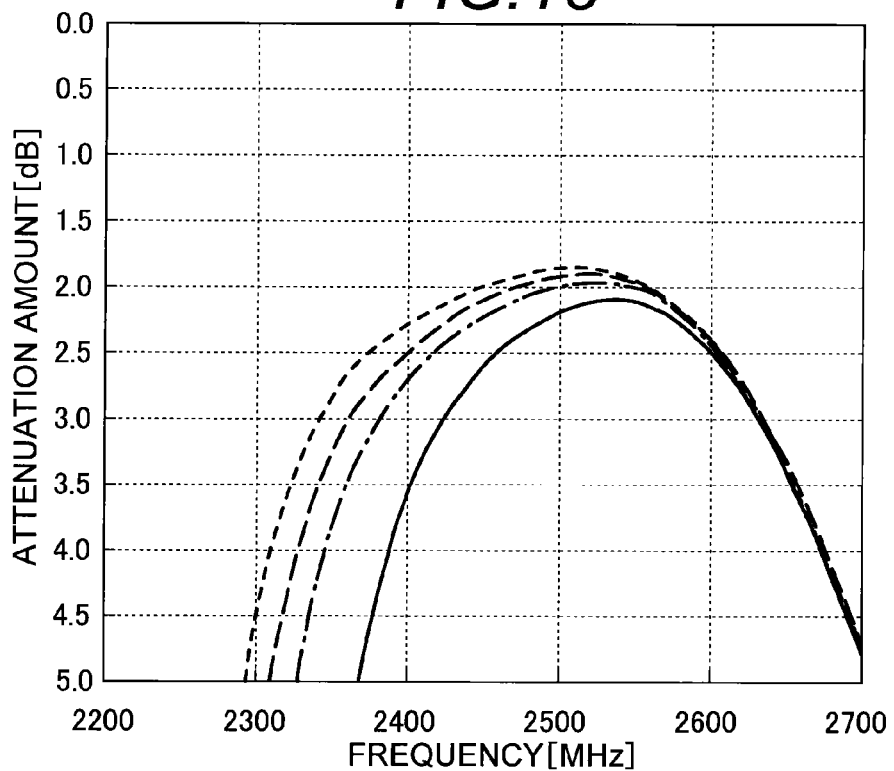
FIG. 18 is a graph showing part of the graph (bandpass area) in FIG. 17 in an enlarged view.
Figure 19:
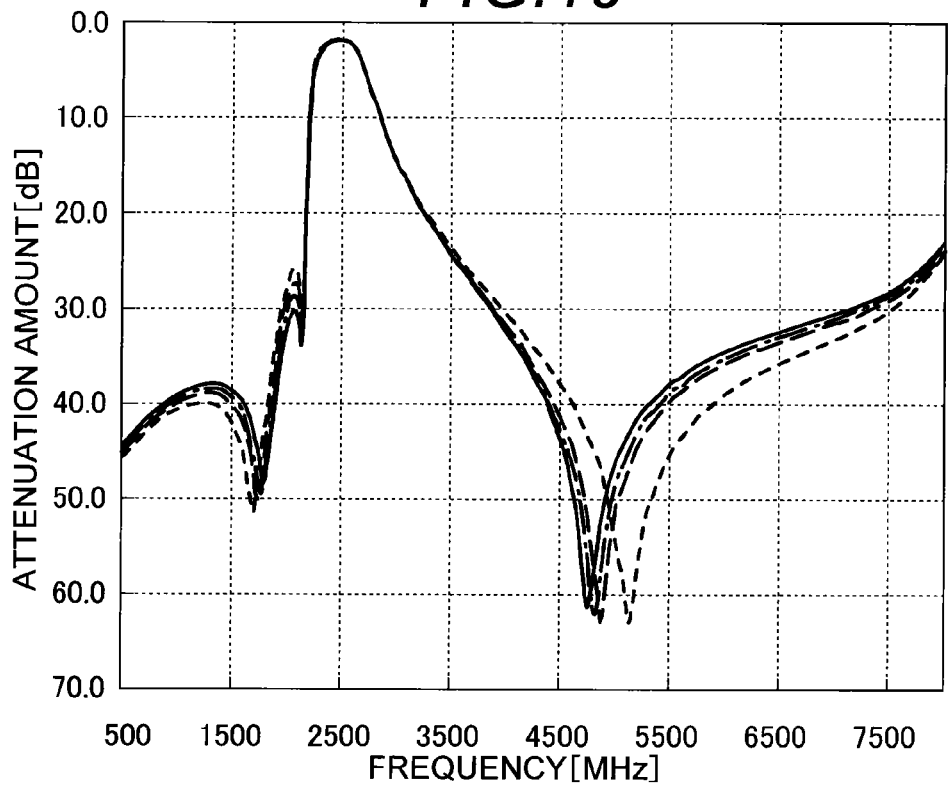
FIG. 19 is a graph representing the frequency characteristic of the filter in the module according to the first embodiment shown in FIG. 16 when the distance is changed between the surface of the PCB and the shield case.
Figure 20:
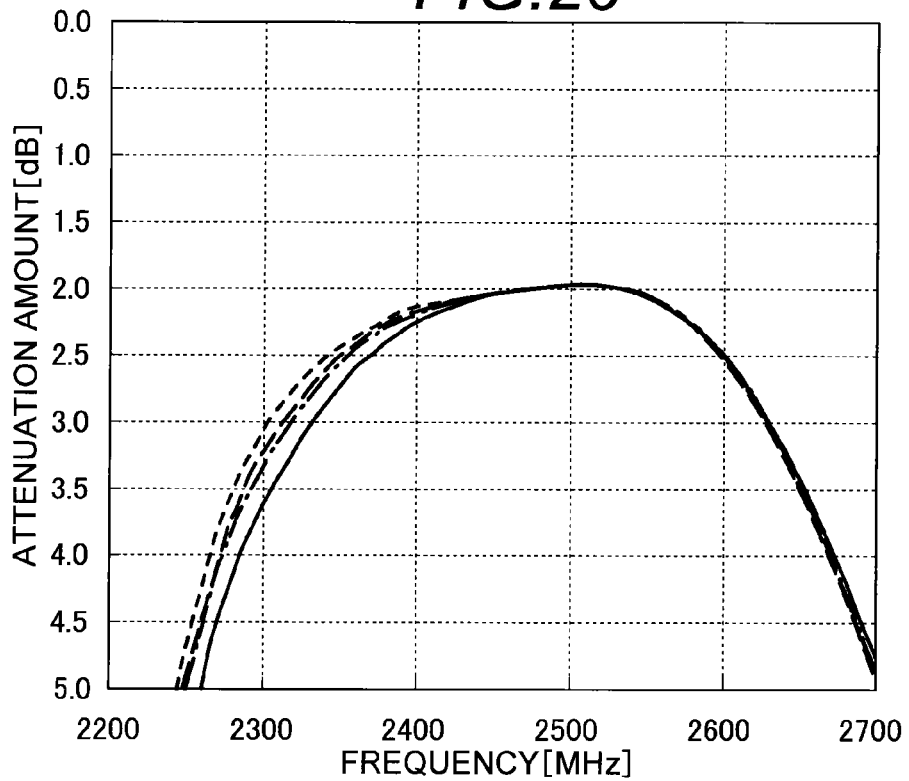
FIG. 20 is a graph showing part of the graph (bandpass area) in FIG. 19 in an enlarged view.

Further, Table 3 below and FIGS. 17 and 18 show the filter characteristics (pass characteristic and attenuation characteristic) for the conventional module shown in FIG. 15, which were obtained as a result of performing a simulation which varied the distance hs from the surface of the PCB 60 to the shield case 91. Table 4 below and FIGS. 19 and 20 in turn show the result of a similar simulation performed for the module according to the first embodiment shown in FIG. 16. In FIGS. 17 through 20, a solid line represents the characteristic when the distance hs was chosen to 600 µm; a one-dot-chain line represents the characteristic when the distance was chosen to 700 µm; a rough broken line represents the characteristic when the distance hs was chosen to 800 µm; and a fine broken line represents the characteristic when the distance hs was chosen to be infinite (without the shield case), respectively.

TABLE 3

| | | Calculation Results [dB] | | | |
|---|---|---|---|---|---|
| | Frequency [MHz] | Without shield Case | 800 µm | 700 µm | 600 µm |
| Insertion Loss | 2400-2500 | 2.3 | 2.6 | 2.8 | 3.8 |
| Attenuation Amount | 880-915 | 38 | 37 | 37 | 36 |
| | 1710-1850 | 37 | 35 | 34 | 33 |
| | 1850-1910 | 44 | 39 | 37 | 34 |
| | 1920-1990 | 40 | 48 | 48 | 40 |
| | 2110-2170 | 31 | 34 | 36 | 34 |
| | 4800-5000 | 43 | 47 | 49 | 54 |

TABLE 4

| | | Calculation Results [dB] | | | |
|---|---|---|---|---|---|
| | Frequency [MHz] | Without shield Case | 800 µm | 700 µm | 600 µm |
| Insertion Loss | 2400-2500 | 2.2 | 2.2 | 2.2 | 2.3 |
| Attenuation Amount | 880-915 | 41 | 41 | 40 | 40 |
| | 1710-1850 | 50 | 48 | 46 | 44 |
| | 1850-1910 | 35 | 38 | 40 | 43 |
| | 1920-1990 | 30 | 31 | 32 | 33 |
| | 2110-2170 | 28 | 29 | 29 | 30 |
| | 4800-5000 | 50 | 50 | 50 | 50 |

As is apparent from the results above, it is understood that when the shield case is made to have a lower height (so that the shield case is placed closer to the PCB), the conventional structure suffers from fierce deteriorations in filter characteristics, whereas the structure according to this embodiment exhibits satisfactory characteristics without severe influence.

Second Embodiment

Figure 21:
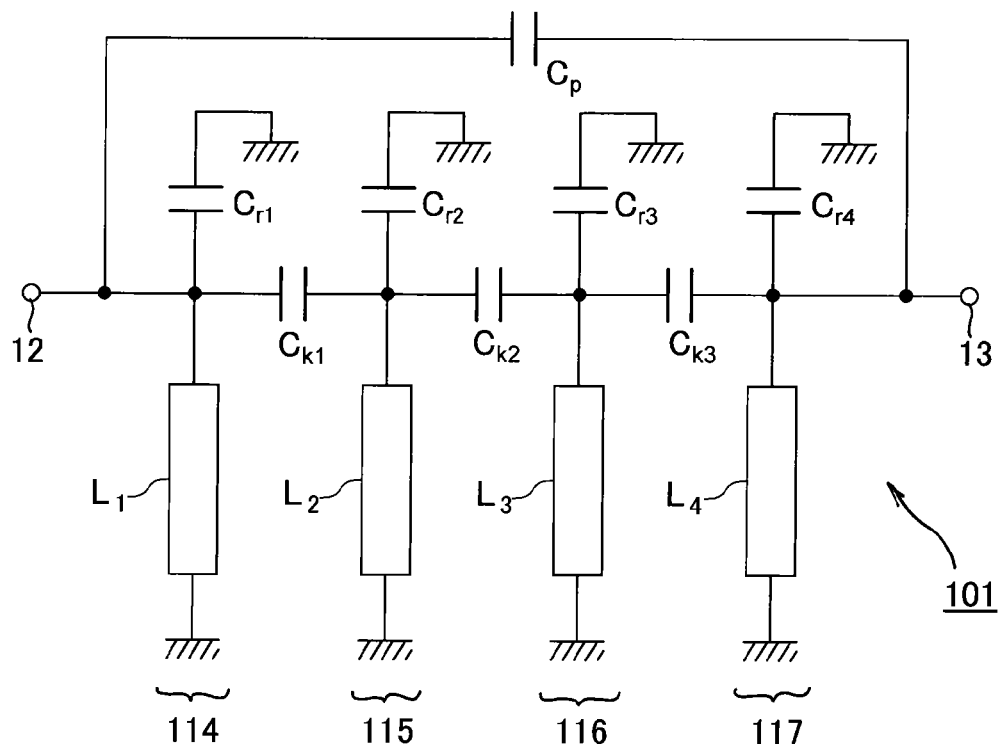
FIG. 21 is an equivalent circuit diagram of a BPF disposed in an BPF module according to a second embodiment of the present invention.

FIG. 21 is a circuit diagram showing a BPF chip which may be employed in a module according to a second embodiment of the present invention. While the first embodiment employs a BPF which comprises three resonators, this embodiment employs a BPF chip 101 which comprises four resonators disposed in a laminated board (LTCC board), including a first resonator 114, a second resonator 115, a third resonator 116, and a fourth resonator 117 connected in order between an input terminal 12 and an output terminal 13, as shown in FIG. 21.

Also, this embodiment is similar to the first embodiment in that middle-stage resonators, i.e., the second resonator 115 and third resonator 116 are disposed in the chip middle zone, and that these middle-stage resonators 115, 116 are made up of inductor electrodes and capacitor electrodes which are formed on wiring layers in a lower portion of the chip 101.

Figure 22:
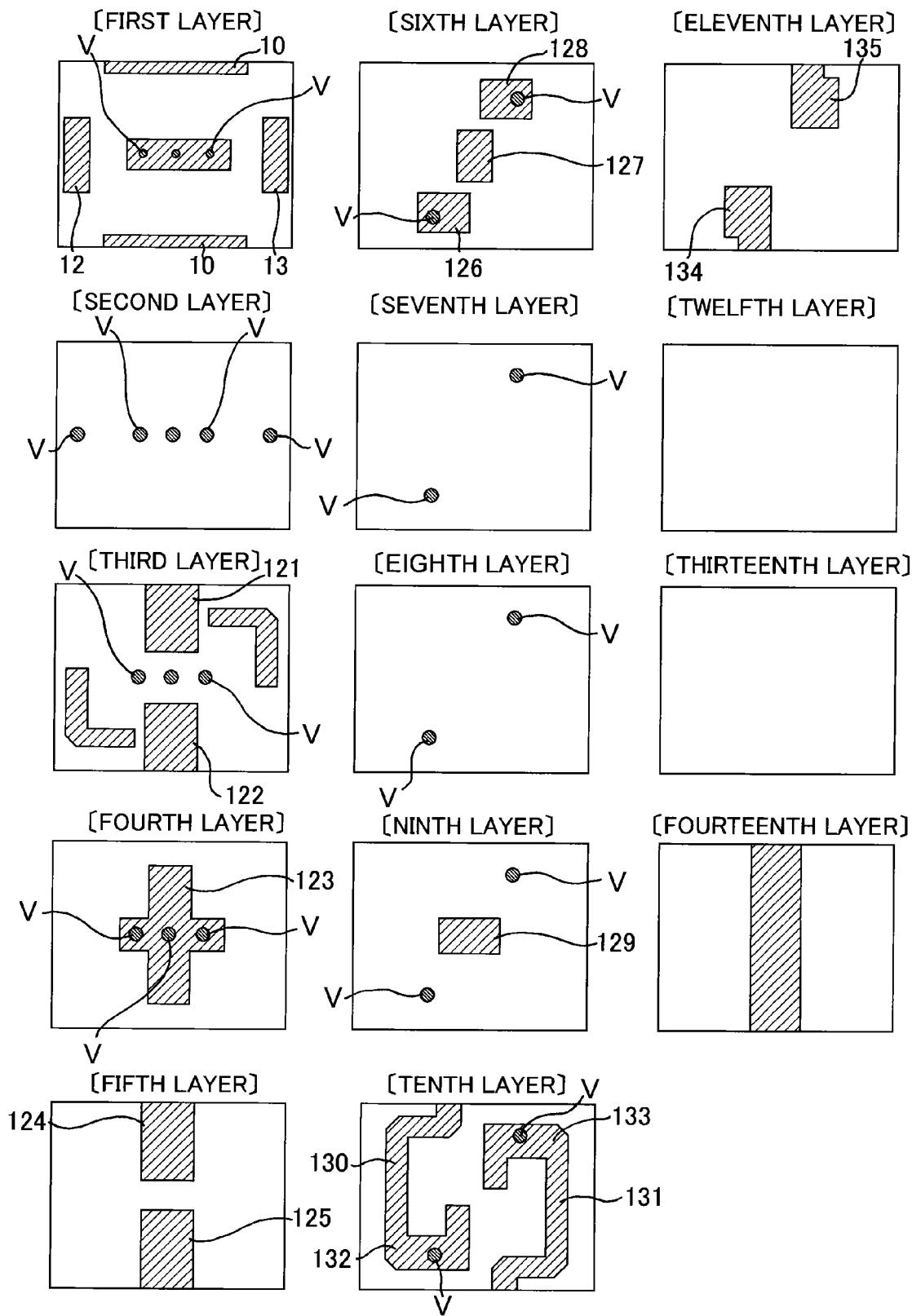
FIG. 22 is a diagram showing a laminated structure (respective wiring layers of a laminated board, from a first through a fourteenth layer) of the BPF in the second embodiment.

Conductor patterns on each wiring layer are formed as shown in FIG. 22. As shown in FIG. 22, a laminated board employed herein has fourteen wiring layers. The input terminal 12, output terminal 13, and ground terminals 10 are disposed on a first layer which is the bottom of the chip, and the middle-stage resonators, i.e., second resonator 115 and third resonator 116 (inductors $L_2$, $L_3$ and capacitors $C_{r2}$, $C_{r3}$) are formed of electrodes 121-125 placed on a third through a fifth layer, respectively. In this regard, the electrodes 121-125, which form the second resonator 115 and third resonator 116, are placed in the chip middle zone, as is the case with the first embodiment.

Also, a sixth layer is provided with an electrode 126 of a capacitor $C_{k1}$ for coupling the first resonator 114 to the second resonator 115; an electrode 127 of a capacitor $C_{k2}$ for coupling the second resonator 115 to the third resonator 116; and an electrode 128 of a capacitor $C_{k3}$ for coupling the third resonator 116 to the fourth resonator 117, and a ninth layer is provided with an electrode 129 which forms part of a bypass capacitor $C_p$. Further, a tenth layer and an eleventh layer comprise inductor electrodes 130, 131 and capacitor electrodes 132, 133 which make up the first resonator 114, i.e., the first-stage resonator, and the fourth resonator 117, i.e., the final-stage resonator, respectively. In this way, the present invention may instead use the filter 101 which includes four resonators 114-117 as a filter mounted on the mounting board.

Third Embodiment

Further, while the first and second embodiments employ a laminated board for forming a filter chip, the filter chip can be alternatively implemented by a so-called thin-film chip which involves the lamination using a thin-film technology (vapor deposition method).

Figure 23:
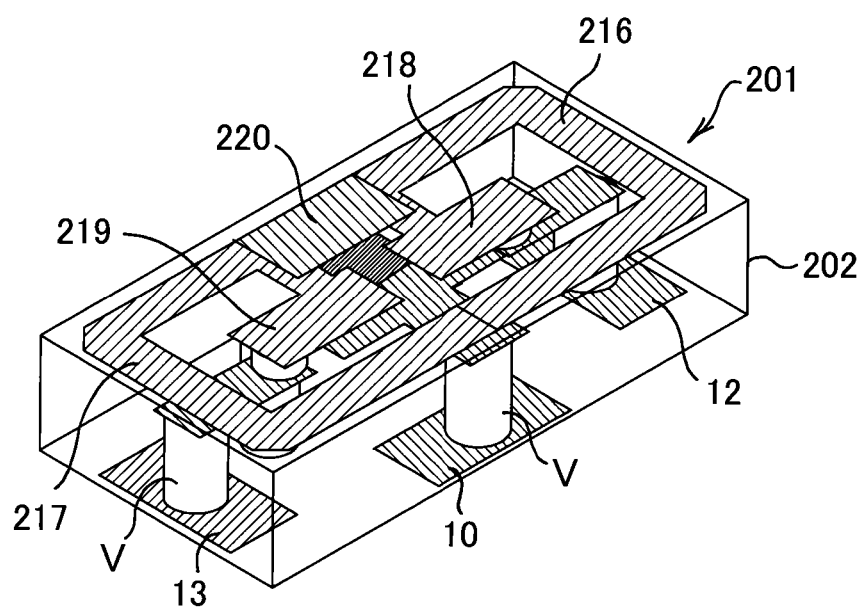
FIG. 23 is a perspective view showing a BPF disposed in a BPF module according to a third embodiment in a see-through representation.

In a third embodiment of the present invention, such a thin-film chip is mounted on the surface of the PCB 70 instead of the chip 11 of the first embodiment. As shown in FIG. 23, this thin-film chip 201 is fabricated by alternately depositing electrode films and insulating films using a vapor deposition method such as sputtering, vapor deposition, and the like to form each wiring layer. Also, the chip 201 is a filter which comprises three (first through third) resonators 14-16, like the first embodiment.

Figure 24:
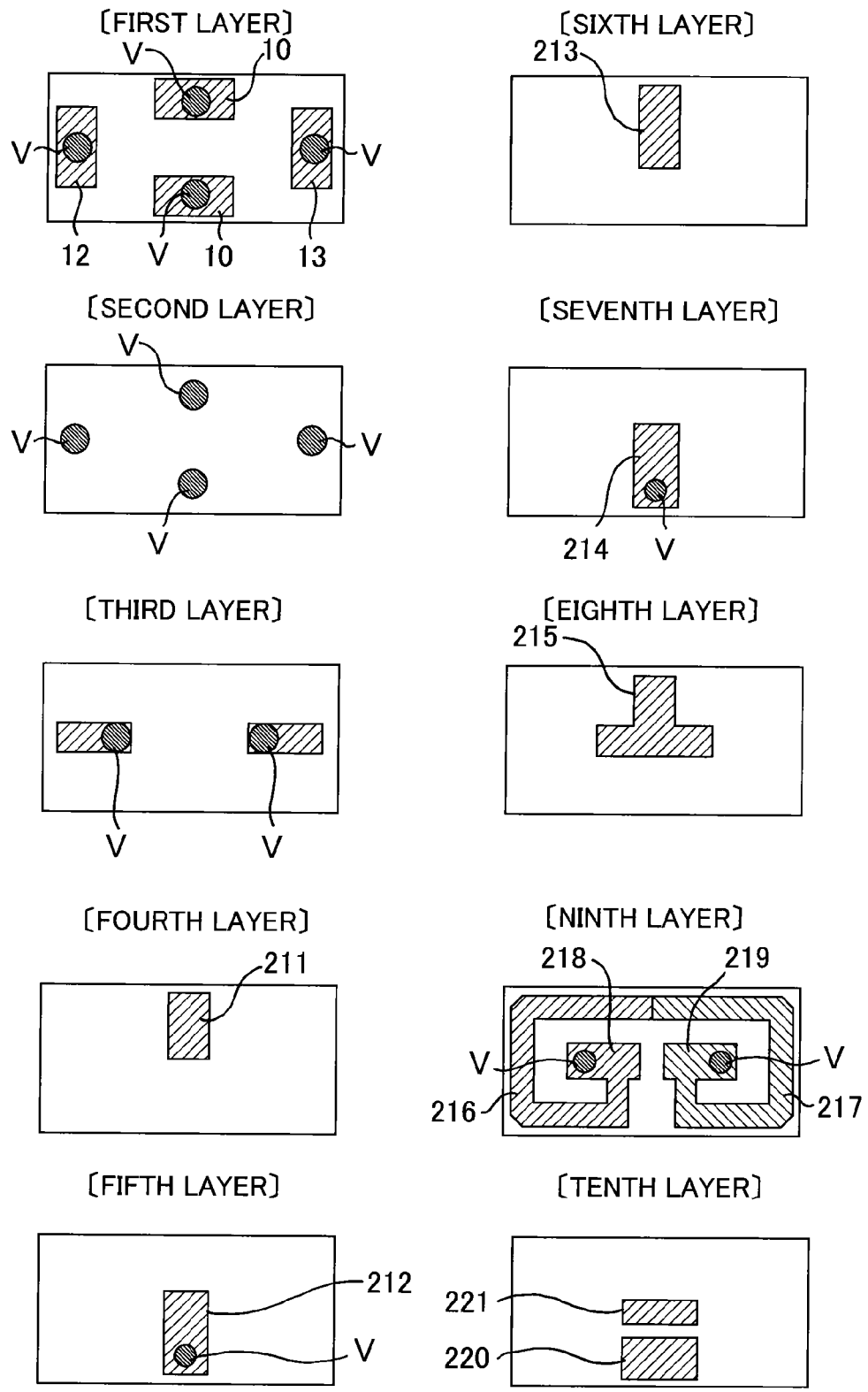
FIG. 24 is a diagram showing a laminated structure (respective wiring layers of a laminated board, a first through a tenth layer) of the BPF in the third embodiment.

As shown in FIG. 24, the chip 201 has ten wiring layers in this example. Like the chip in the first embodiment, an input terminal 12, an output terminal 13, and ground terminals 10 are each disposed on the first layer which is the bottom of the chip, and these terminals 12, 13, 10 are connected to respective conductor patterns formed on the surface of a base board through vias V. Also, like the first embodiment, electrodes 211-215 are disposed on a fourth layer through an eighth layer for forming the second resonator (inductor $L_2$ and capacitor $C_{r2}$) 15, where these electrodes 211-215 are located in the chip middle zone. Further, electrodes 216-220 are disposed on a ninth layer and a tenth layer for making up inductors $L_1$, $L_3$ and capacitors $C_{r1}$, $C_{r3}$ of the first resonator 14 and third resonator 16, respectively, where these electrodes are located in the end zones of the chip, like the first embodiment. Additionally, an electrode 211 is disposed in the center area of the tenth layer for forming a bypass capacitor.

According to this embodiment (thin-film chip), the module can be advantageously reduced in height (thickness) by keeping the height of the filter chip low. Specifically, as to the chip of the first embodiment and the conventional chip of vertically laminated type (FIGS. 3-5), the chips can be reduced in height dimension, for example, to approximately 0.35 mm at present, whereas according to this thin-film chip, the height dimension can be reduced, for example, to approximately 0.2 mm (the chip is 1.0 mm long and 0.5 mm wide).

Figure 25:
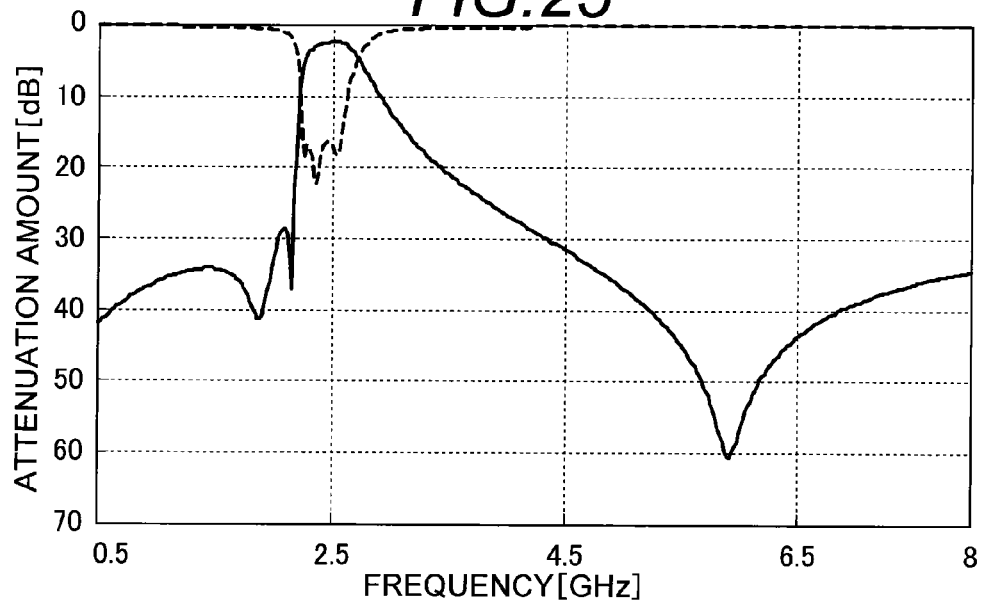
FIG. 25 is a graph representing the frequency characteristic of the BPF in the third embodiment.

FIG. 25 shows the filter characteristics of this embodiment. As shown in FIG. 25, according to this embodiment, it is possible to accomplish characteristics comparable to those of conventional filters (vertically laminated type) by the use of a mounting board (PCB) 70 similar to the first embodiment, even if the chip is significantly reduced in height as compared with conventional modules.

DESCRIPTION OF REFERENCE NUMERALS $C_{k1}$, $C_{k2}$, $C_{k3}$ Inter-Stage Capacitors
$C_p$ Bypass Capacitor
$C_{r1}$, $C_{r2}$, $C_{r3}$, $C_{r4}$ Capacitors
$L_1$, $L_2$, $L_3$, $L_4$ Inductors
S1 Chip Middle Area
S2 Chip Center Area
S3 One Longitudinal Side of Chip
S4 Other Longitudinal Side of Chip
S5, 80 Ground-Free Space
V Via Hole
10 Ground Terminal
11, 51, 55, 101, 201 BPF Chips
12 Input Terminal
13 Output Terminal
14, 114 First-Stage Resonators
15, 115, 116 Middle-Stage Resonators
16, 117 Final-Stage Resonators
21-24, 121-125, 211-215 Electrodes Forming Middle-Stage Resonators (Inductors and Capacitors)
21a-24a Proximal Ends of Electrodes
25, 26, 126-128 Electrodes of Coupling Capacitors
27, 129, 221 Electrodes of Bypass Capacitors
28, 130, 216 Inductor Electrodes of First-Stage Resonator
29, 131, 217 Inductor Electrodes of Final-Stage Resonator
30, 32, 132, 134, 218, 220 Capacitor Electrodes of First-Stage Resonator
31, 33, 133, 135, 219, 220 Capacitor Electrodes of Final-Stage Resonator
50 Electrode
60, 70 Mounting Boards (PCBs)
61, 71 Surfaces of Mounting Boards
62, 72 Uppermost Inner Wiring Layers
63, 64, 73, 74 Ground Electrodes

65 Input Conductor Line
66 Output Conductor Line
202 Base Board

The invention claimed is:

1. A bandpass filter module comprising:
   a mounting board capable of mounting a filter chip on a surface thereof; and
   a filter chip mounted on the surface of said mounting board, wherein
   said mounting board comprises one or more internal wiring layers;
   said filter chip includes three or more resonators connected between an input terminal and an output terminal for forming a predetermined pass band;
   said filter chip includes a chip middle zone defined by an area contained between one longitudinal side and another longitudinal side of said filter chip, said chip middle zone including a chip center zone defined by an area contained between one lateral side and another lateral side of said filter chip, wherein said three or more resonators include a first-stage resonator connected closest to the input terminal, a final-stage resonator connected closest to the output terminal, and a middle-stage resonator connected between said first-stage resonator and said final-stage resonator, said middle-stage resonator being disposed in said chip middle zone;
   said mounting board includes an area overlapping with said chip center zone, when viewed from above, said area defining a ground-free space in which no ground electrode is disposed, said ground-free space being formed at least from the surface of said mounting board to a depth position at which a topmost internal wiring layer is located among said one or more internal wiring layers;
   said ground-free space comprises a hole formed through the surface of said mounting board; and
   the hole is free from conductors.

2. A bandpass filter module according to claim 1, wherein:
   said ground-free space is filled with an insulating material.

3. A bandpass filter module according to claim 1, wherein:
   each of said resonators is formed of an inductor electrode and capacitor electrodes disposed on some of a plurality of wiring layers included in a laminated board, and
   said middle-stage resonator comprises an inductor electrode and capacitor electrodes disposed on internal wiring layers of said laminated board.

4. A bandpass filter module according to claim 1, wherein:
   said resonators are formed in a laminated board, and
   said laminated board is an LTCC board.

5. A bandpass filter module according to claim 1, wherein:
   said filter chip comprises a thin-film chip having wiring layers and insulating layers laminated on a surface of a base board by a vapor deposition method, and
   said resonators are located on wiring layers formed on the surface of said base board.

6. An electronic module comprising:
   a bandpass filter module according to claim 1; and
   one or more electrical function elements mounted on said mounting board and electrically connected to said filter chip.

7. A bandpass filter module according to claim 1, wherein:
   said filter chip is equally divided by two in a thickness direction, wherein said middle-stage resonator is disposed in a lower half close to said mounting board.

8. A bandpass filter module according to claim 2, wherein:
   said filter chip is equally divided by two in a thickness direction, wherein said middle-stage resonator is disposed in a lower half close to said mounting board.

9. A bandpass filter module according to claim 3, wherein:
   said filter chip is equally divided by two in a thickness direction, wherein said middle-stage resonator is disposed in a lower half close to said mounting board.

10. A bandpass filter module according to claim 4, wherein:
    said filter chip is equally divided by two in a thickness direction, wherein said middle-stage resonator is disposed in a lower half close to said mounting board.

11. A module board having one or more internal wiring layers and a filter mounting area capable of mounting a filter chip on a surface thereof, comprising:
    an input terminal electrode disposed on one longitudinal side of said filter mounting area and capable of receiving an input terminal of a filter chip;
    an output terminal electrode disposed on another longitudinal side of said filter mounting area and capable of receiving an output terminal of the filter chip; and
    a ground terminal electrode disposed on one lateral side of said filter mounting area and capable of receiving a ground terminal of the filter chip, wherein
    said filter mounting area includes a central area which occupies a center zone thereof, when viewed from above, said central area defining a ground-free space in which no ground electrode is disposed, said ground-free space being formed at least from the surface of said mounting board to a depth position at which a topmost internal wiring layer is located among said one or more internal wiring layers;
    said ground-free space comprises a hole formed through the surface of said mounting board; and
    the hole is free from conductors.

12. A module board according to claim 11, wherein:
    said ground-free space is filled with an insulating material.

* * * * *